(12) United States Patent
McElhinny et al.

(10) Patent No.: US 12,341,117 B2
(45) Date of Patent: Jun. 24, 2025

(54) METHODS AND APPARATUS TO REDUCE DEFECTS IN INTERCONNECTS BETWEEN SEMICONDUCTOR DIES AND PACKAGE SUBSTRATES

(71) Applicant: Intel Corporation, Santa Clara, CA (US)

(72) Inventors: Kyle McElhinny, Tempe, AZ (US); Hongxia Feng, Chandler, AZ (US); Xiaoying Guo, Chandler, AZ (US); Steve Cho, Chandler, AZ (US); Jung Kyu Han, Chandler, AZ (US); Changhua Liu, Chandler, AZ (US); Leonel Arana, Phoenix, AZ (US); Rahul Manepalli, Chandler, AZ (US); Dingying Xu, Chandler, AZ (US); Amram Eitan, Scottsdale, AZ (US)

(73) Assignee: Intel Corporation, Santa Clara, CA (US)

( * ) Notice: Subject to any disclaimer, the term of this patent is extended or adjusted under 35 U.S.C. 154(b) by 187 days.

(21) Appl. No.: 17/484,499

(22) Filed: Sep. 24, 2021

(65) Prior Publication Data
US 2023/0095281 A1 Mar. 30, 2023

(51) Int. Cl.
*H01L 23/00* (2006.01)
*H01L 21/60* (2006.01)
*H01L 23/488* (2006.01)
*H01L 23/538* (2006.01)

(52) U.S. Cl.
CPC ............. *H01L 24/14* (2013.01); *H01L 21/60* (2021.08); *H01L 23/488* (2013.01); *H01L 23/5381* (2013.01); *H01L 23/5386* (2013.01); *H01L 2021/60022* (2013.01)

(58) Field of Classification Search
CPC ....... H01L 24/14; H01L 21/60; H01L 23/488; H01L 23/5381; H01L 23/5386
USPC .......................................................... 257/737
See application file for complete search history.

(56) References Cited

U.S. PATENT DOCUMENTS

| | | | |
|---|---|---|---|
| 2014/0191390 A1* | 7/2014 | Chuang | H01L 24/05 257/737 |
| 2018/0233474 A1 | 8/2018 | Yu | |
| 2020/0373732 A1* | 11/2020 | Chen | H01S 5/02325 |
| 2021/0249381 A1* | 8/2021 | Knickerbocker | H01L 21/563 |
| 2023/0096835 A1 | 3/2023 | McElhinny et al. | |

(Continued)

FOREIGN PATENT DOCUMENTS

EP 3361502 A1 8/2018

OTHER PUBLICATIONS

European Patent Office, "Partial European Search Report," issued in connection with European Patent Application No. 22197135.1, mailed on Feb. 28, 2023, 16 pages.

(Continued)

*Primary Examiner* — Quoc D Hoang
(74) *Attorney, Agent, or Firm* — Hanley, Flight & Zimmerman, LLC

(57) ABSTRACT

Methods and apparatus to reduce defects in interconnects between semiconductor dies and package substrates are disclosed. An apparatus includes a substrate and a semiconductor die mounted to the substrate. The apparatus further includes bumps to electrically couple the die to the substrate. Ones of the bumps have corresponding bases. The bases have a shape that is non-circular.

25 Claims, 14 Drawing Sheets

(56) References Cited

U.S. PATENT DOCUMENTS

2023/0097624 A1 3/2023 McElhinny et al.
2024/0222304 A1 7/2024 Shan et al.
2024/0243087 A1 7/2024 Carrazzone et al.

OTHER PUBLICATIONS

Wikipedia, "Solder alloys," Sep. 13, 2021, retrieved from the internet at https://en.wikipedia.org/w/index.php?tille=Solder_alloys&oldid=1044098274 on Feb. 15, 2023, 31 pages.

"Solder Alloys," Wikipedia, Sep. 13, 2021, retrieved from https://en.wikipedia.org/w/index.php?title=Solder_alloys&oldid=1044098274 on Jul. 18, 2023, 25 pages.

European Patent Office, "Extended European Search Report," issued in connection with European Patent Application No. 22197135.1, dated Jun. 1, 2023, 13 pages.

* cited by examiner

METHODS AND APPARATUS TO REDUCE DEFECTS IN INTERCONNECTS BETWEEN SEMICONDUCTOR DIES AND PACKAGE SUBSTRATES

FIELD OF THE DISCLOSURE

This disclosure relates generally to integrated circuits and, more particularly, to methods and apparatus to reduce defects in interconnects between semiconductor dies and package substrates.

BACKGROUND

In many integrated circuit packages, one or more semiconductor dies are mechanically and electrically coupled to an underlying package substrate. Frequently, the coupling of a die to an underlying substrate is achieved by aligning and connecting metal bumps fabricated on a surface of the die with corresponding pads and/or bumps on a facing surface of the package substrate. As integrated circuits and their associated packages continue to decrease in size, the bumps and/or pads associated with first level interconnects also need to decrease in size.

Figure 1:
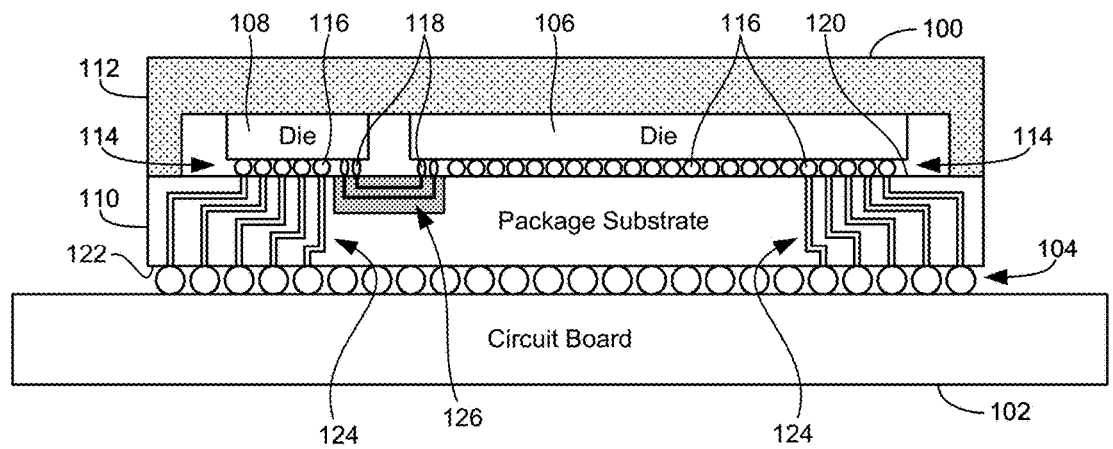
FIG. 1 illustrates an example integrated circuit (IC) package that includes two example semiconductor dies electrically coupled to a package substrate that is electrically coupled to a circuit board.

The figures are not necessarily to scale. Instead, the thickness of the layers or regions may be enlarged in the drawings. Although the figures show layers and regions with clean lines and boundaries, some or all of these lines and/or boundaries may be idealized. In reality, the boundaries and/or lines may be unobservable, blended, and/or irregular. In general, the same reference numbers will be used throughout the drawing(s) and accompanying written description to refer to the same or like parts. As used herein, unless otherwise stated, the term "above" describes the relationship of two parts relative to Earth. A first part is above a second part, if the second part has at least one part between Earth and the first part. Likewise, as used herein, a first part is "below" a second part when the first part is closer to the Earth than the second part. As noted above, a first part can be above or below a second part with one or more of: other parts therebetween, without other parts therebetween, with the first and second parts touching, or without the first and second parts being in direct contact with one another. Notwithstanding the foregoing, in the case of a semiconductor device, "above" is not with reference to Earth, but instead is with reference to a bulk region of a base semiconductor substrate (e.g., a semiconductor wafer) on which components of an integrated circuit are formed. Specifically, as used herein, a first component of an integrated circuit is "above" a second component when the first component is farther away from the bulk region of the semiconductor substrate than the second component. As used in this patent, stating that any part (e.g., a layer, film, area, region, or plate) is in any way on (e.g., positioned on, located on, disposed on, or formed on, etc.) another part, indicates that the referenced part is either in contact with the other part, or that the referenced part is above the other part with one or more intermediate part(s) located therebetween. As used herein, connection references (e.g., attached, coupled, connected, and joined) may include intermediate members between the elements referenced by the connection reference and/or relative movement between those elements unless otherwise indicated. As such, connection references do not necessarily infer that two elements are directly connected and/or in fixed relation to each other. As used herein, stating that any part is in "contact" with another part is defined to mean that there is no intermediate part between the two parts.

Unless specifically stated otherwise, descriptors such as "first," "second," "third," etc., are used herein without imputing or otherwise indicating any meaning of priority, physical order, arrangement in a list, and/or ordering in any way, but are merely used as labels and/or arbitrary names to distinguish elements for ease of understanding the disclosed examples. In some examples, the descriptor "first" may be used to refer to an element in the detailed description, while the same element may be referred to in a claim with a different descriptor such as "second" or "third." In such instances, it should be understood that such descriptors are used merely for identifying those elements distinctly that might, for example, otherwise share a same name. As used herein, "approximately" and "about" refer to dimensions that may not be exact due to manufacturing tolerances and/or other real world imperfections.

DETAILED DESCRIPTION

FIG. 1 illustrates an example integrated circuit (IC) package 100 that is electrically coupled to a circuit board 102 via an array of bumps or balls 104 (e.g., a ball grid array). In some examples, the IC package 100 may include pins and/or pads, in addition to or instead of the balls 104, to enable the electrical coupling of the package 100 to the circuit board 102. In this example, the package 100 includes two semiconductor (e.g., silicon)dies 106, 108 that are mounted to a package substrate 110 and enclosed by a package lid or mold compound 112. While the example IC package 100 of FIG. 1 includes two dies 106, 108, in other examples, the package 100 may have only one die or more than two dies.

As shown in the illustrated example, each of the dies 106, 108 is electrically and mechanically coupled to the package substrate 110 via corresponding arrays of bumps 114. The electrical connections between the dies 106, 108 and the package substrate 110 (e.g., the bumps 114) are sometimes referred to as first level interconnects. By contrast, the electrical connections between the IC package 100 and the circuit board 102 (e.g., the balls 104) are sometimes referred to as second level interconnects. In some examples, one or both of the dies 106, 108 may be stacked on top of one or more other dies. In such examples, the dies 106, 108 are coupled to the underlying die through a first set of first level interconnects and the underlying die may be connected to the package substrate 110 via a separate set of first level interconnects associated with the underlying die. Thus, as used herein, first level interconnects refer to bumps between a die and a package substrate or a die and an underlying die.

As shown in FIG. 1, the bumps 114 of the first level interconnects include two different types of bumps corresponding to core bumps 116 and bridge bumps 118. As used herein, core bumps 116 refer to bumps on the dies 106, 108 through which electrical signals pass between the dies 106, 108 and components external to the IC package 100. Thus, as shown in the illustrated example, the core bumps 116 physically connected to the inner surface 120 of the substrate 110 are electrically coupled to the balls 104 on the external surface 122 of the substrate 110 via internal interconnects or traces 124 within the substrate 110. As used herein, bridge bumps 118 refer to bumps on the dies 106, 108 through which electrical signals pass between different ones of the dies 106, 108 within the package 100. Thus, as shown in the illustrated example, the bridge bumps 118 of the first die 106 are electrically coupled to the bridge bumps 118 of the second die 108 via an interconnect bridge 126 embedded in the package substrate 110. As represented in FIG. 1, core bumps 116 are typically larger than bridge bumps 118.

The bumps 114 associated with the first level interconnects are fabricated through a series of different processes that can lead to potential defects when an IC package such as the package 100 of FIG. 1 is assembled. In particular, the bumps 114 are initially formed through a lithographic process by which a dry film resist is applied to the surface where the bumps 114 are to be formed. The dry film resist is patterned with openings corresponding to the locations of the individual bumps and then a plating process is performed to fill the openings with metal that is to serve as the bumps 114. Often, the metal used for the plating of the bumps 114 include a layer of copper that is in electrical contact with metal interconnects within the substrate onto which the bumps 114 are being formed. Thereafter, a nickel barrier layer is added onto the copper and then a layer of tin is added onto the nickel.

Figure 2:
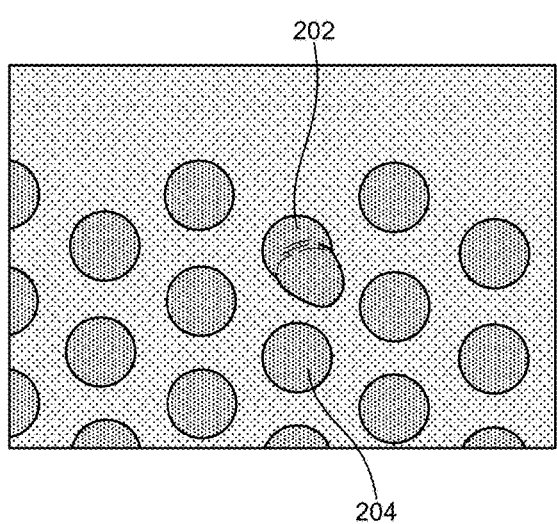
FIG. 2 is an illustration based on a scanning electron microscope (SEM) image of a plan or top view of an array of bridge bumps showing the tin on a first bridge bump has shifted toward a second bridge bump 204.
Figure 3:
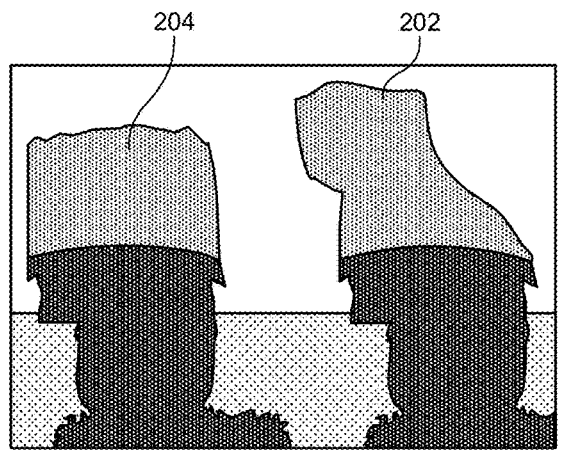
FIG. 3 is an illustration based on an SEM image of a cross-sectional view of the first and second bridge bumps of FIG. 2.

Once the tin is added into the openings of the dry film resist, the resist is removed through a stripping process. During the stripping process, the dry film resist can swell in a manner that can cause the layer of tin to shift or shear as shown in FIGS. 2 and 3. Specifically, FIG. 2 is an illustration based on a scanning electron microscope (SEM) image of a plan or top view of an array of bridge bumps in which the tin on a first bridge bump 202 has shifted toward a second bridge bump 204. FIG. 3 is an illustration based on an SEM image of a cross-sectional view of the first and second bridge bumps 202, 204 of FIG. 2. The shifting of the tin, as shown on the first bridge bump 202 in FIGS. 2 and 3 is undesirable because it can create an unintended bridge or connection with the tin of an adjacent bump (e.g., the second bridge bump 204). Although the tin on the first bridge bump 202 of FIGS. 2 and 3 does not extend all the way to the second bridge bump 204, the shifting of the tin on the first bridge bump 202 is still problematic because it increases the likelihood that the tin may merge with or come into contact with the adjacent second bridge bump 204 during subsequent processing steps.

The shifting of tin as shown in FIGS. 2 and 3 is a more common occurrence for bridge bumps 118 than for core bumps 116 because of the difference in size between bridge bumps and core bumps. That is, core bumps 116 are typically large enough to withstand the shearing forces produced by the swelling of the dry film resist during the stripping process. By contrast, bridge bumps 118, which are typically much smaller than core bumps 116, are more susceptible to being shifted during the stripping process. For instance, bump shifting typically only occurs on bumps with diameters that are less than 50 μm and becomes worse as the size of the bumps decreases below that. For reference, some bridge bumps have diameters less than approximately 20 μm. Furthermore, the shifting of tin is particularly problematic for bridge bumps 118 that have relatively high bump height to bump diameter aspects ratios. However, high bump height to bump diameter aspects ratios are becoming more common as there is a drive to fabricate smaller sized bumps that can be spaced at a smaller pitch. In particular, while the critical dimension (e.g., diameter) and spacing of bumps decreases, the total volume of tin is not decreased proportionately because a threshold amount of tin is needed to produce a reliable bond between a die and underlying substrate. Thus, decreasing the size of bumps while maintaining the same volume of tin results in the plating height of the tin being higher for a higher bump height to bump diameter aspects ratio. As discussed more fully below, examples disclosed herein reduce the concerns of bumps shifting by fabricating protective dummy bumps adjacent operational bumps.

Figure 4:
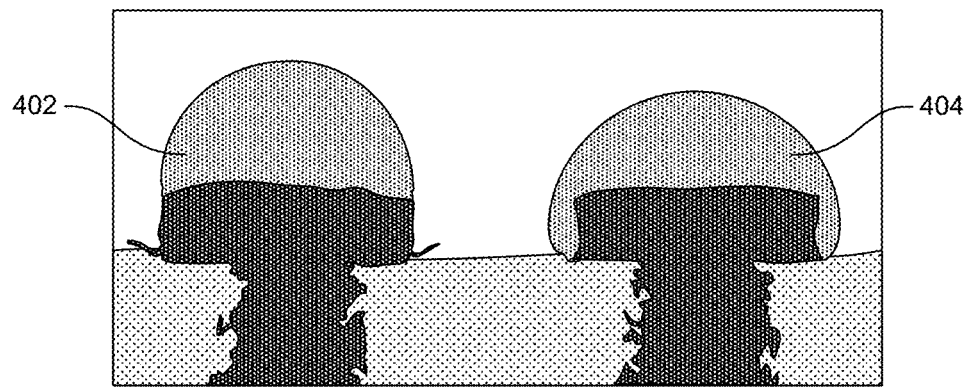
FIG. 4 is an illustration based on an SEM image of a cross-sectional view of two bumps in which tin wicking has occurred with respect to one of the bumps.

Another potential source of defects in bumps 114 of the first level interconnects occurs during a reflow process that follows the removal of the dry film resist. Specifically, the reflow process involves the application of heat to cause the tin to melt in place. The surface tension of the tin typically results in the tin forming a rounded shape on top of the underlying copper and nickel layers (which do not melt because of their higher melting points). The desired formation of a rounded volume of tin, which serves as a solder ball for attaching the die 106, 108 to the substrate 110, is shown on the first bump 402 on the left side of FIG. 4. However, in some instances, wicking may occur in which the melted tin flows off the edge of the copper/nickel base of the bump and onto the surface of the underlying substrate. This undesirable wicking effect is shown by the second bump 404 on the right side of FIG. 4. Such wicking of the tin can lead to the unintended bridging of bumps in a similar manner to when the tin shifts during the resist stripping process as discussed above. Furthermore, even if the tin does not extend all the way to an adjacent bump (as is the case in FIG. 4), the wicking can create problems for the bonding of the die 106, 108 to the package substrate 110. Specifically, as shown in FIG. 4, the height of the tin in the second bump 404 is considerably lower than the tin in the first bump 402 such that it will be more difficult for the tin in the second bump 404 to reach a mating surface when the die 106, 108 and the substrate 110 are to be bonded together.

The likelihood of wicking is driven by the height to diameter ratio (H/D ratio) of the plated tin. That is, as the height of the tin before reflow (e.g., as shown in FIG. 3) increases relative to the diameter of the nickel-tin interface, the likelihood of wicking also increases. Thus, efforts to scale bump pitch and bump size downwards by producing bumps with higher aspects ratios results in wicking becoming a challenge that is more likely to occur. As discussed more fully below, examples disclosed herein reduce the concerns of wicking by fabricating bumps with different shapes capable of holding larger volumes of tin than standard circular bumps.

Another potential source of defects in bumps 114 of the first level interconnects can arise from warpage in the dies 106, 108 and/or the underlying substrate 110. Warpage can arise during the fabrication of each of the dies 106, 108 and/or the substrate 110 due to mismatches in the coefficient of thermal expansion (CTE) of the materials when heated and/or due to copper density variation during the metal plating process. Warpage can also arise during the thermocompression bonding (TCB) process during which the dies 106, 108 and/or the package substrate 110 are heated and pressed together to enable corresponding bumps and/or pads on the facing surfaces to bond.

Ideally, each of the bumps and/or pads on the facing surfaces of the dies 106, 108 and the package substrate 110 will be co-planar so that all corresponding bumps and/or pads contact one another at the same time when they are pressed together. However, warpage in the dies 106, 108 and/or the substrate 110 result in some bumps and/or pads being higher or jutting outward relative to the average position of the bumps and/or pads while other bumps are lower or recessed relative to the average position of the bumps and/or pads. Due to this lack of co-planarity, when the dies 106, 108 are attached to the substrate 110 during the TCB process, the bumps on the dies 106, 108 and/or substrate 110 that jut outward relative to other bumps will be the first to contact the mating bumps and/or pads on the mating surface while other bumps on the dies 106, 108 and/or substrate 110 will need to be pressed closer together before bonding is possible. The force required to ensure all bumps are properly bonded can cause the bumps that jut outward to be crushed in a manner that can spread the tin of the crushed bump towards adjacent bumps, thereby resulting in undesirable bridging of adjacent bumps. The likelihood of this problem occurring increases as bump pitches scale downward because there is a shorter distance the tin must travel when deformed before an undesirable bridge develops. Furthermore, the bumps and/or pads on facings surfaces of the dies 106, 108 and the substrate 110 that are farthest apart (because they are recessed relative to other bumps) may not be pressed sufficiently close to produce a reliable bond during the TCB process.

Figure 5:
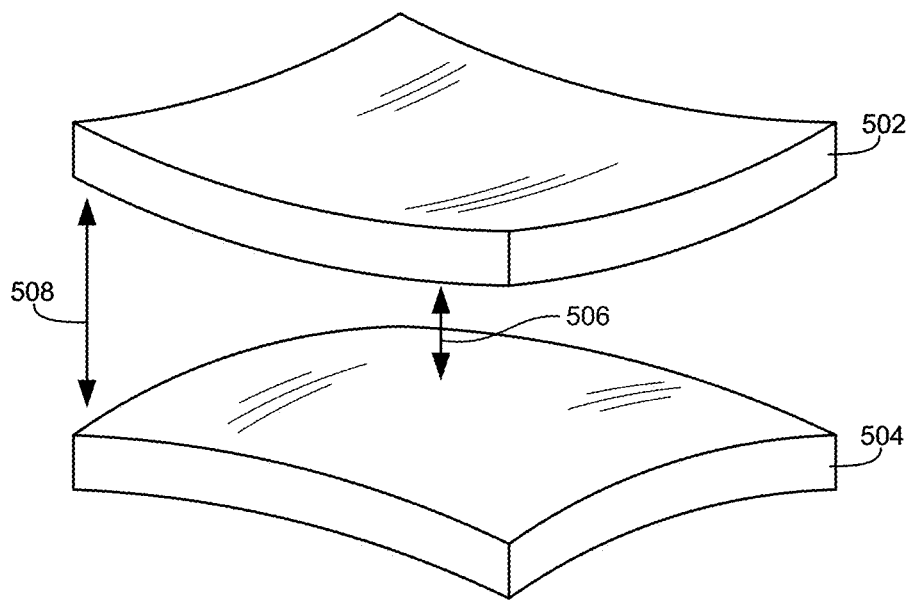
FIG. 5 illustrates an example mode of warpage between a semiconductor die and an underlying substrate to which the die is to be attached.

A common way in which a die and a package substrate (or other underlying die) can warp during the TCB process is by the outer edges of both components bending or curving away from one another as illustrated in FIG. 5. That is, as a die 502 is pressed against an underlying substrate 504, the facing surfaces of the components will warp to form convex-like surfaces. The warpage in the illustrated example of FIG. 5 is exaggerated for purposes of explanation. As shown, the center of the die 502 is a first distance 506 away from the substrate 504, whereas the outer edge of the die 502 is a second distance 508 that is significantly greater than the first distance 506. Warpage as demonstrated in FIG. 5 is likely to result in crushed bumps near the center of the die 502 and/or the substrate 504 and bumps near the outer edge that do not bond properly with corresponding bumps and/or pads on the mating surface. As discussed more fully below, examples disclosed herein reduce the effects of non-coplanar bumps that can arise from substrate warpage by fabricating the bumps to be different heights that vary spatially across the area covered by the bumps at issue to compensate for expected warpage across the same area. Thus, in the illustrated example of FIG. 5, bumps located near the center of the die 502 and associated substrate 504 will be shorter so they jut out less than they would otherwise, while the bumps located near the edges will be taller to reach the additional distance needed for proper bonding.

Figure 6:
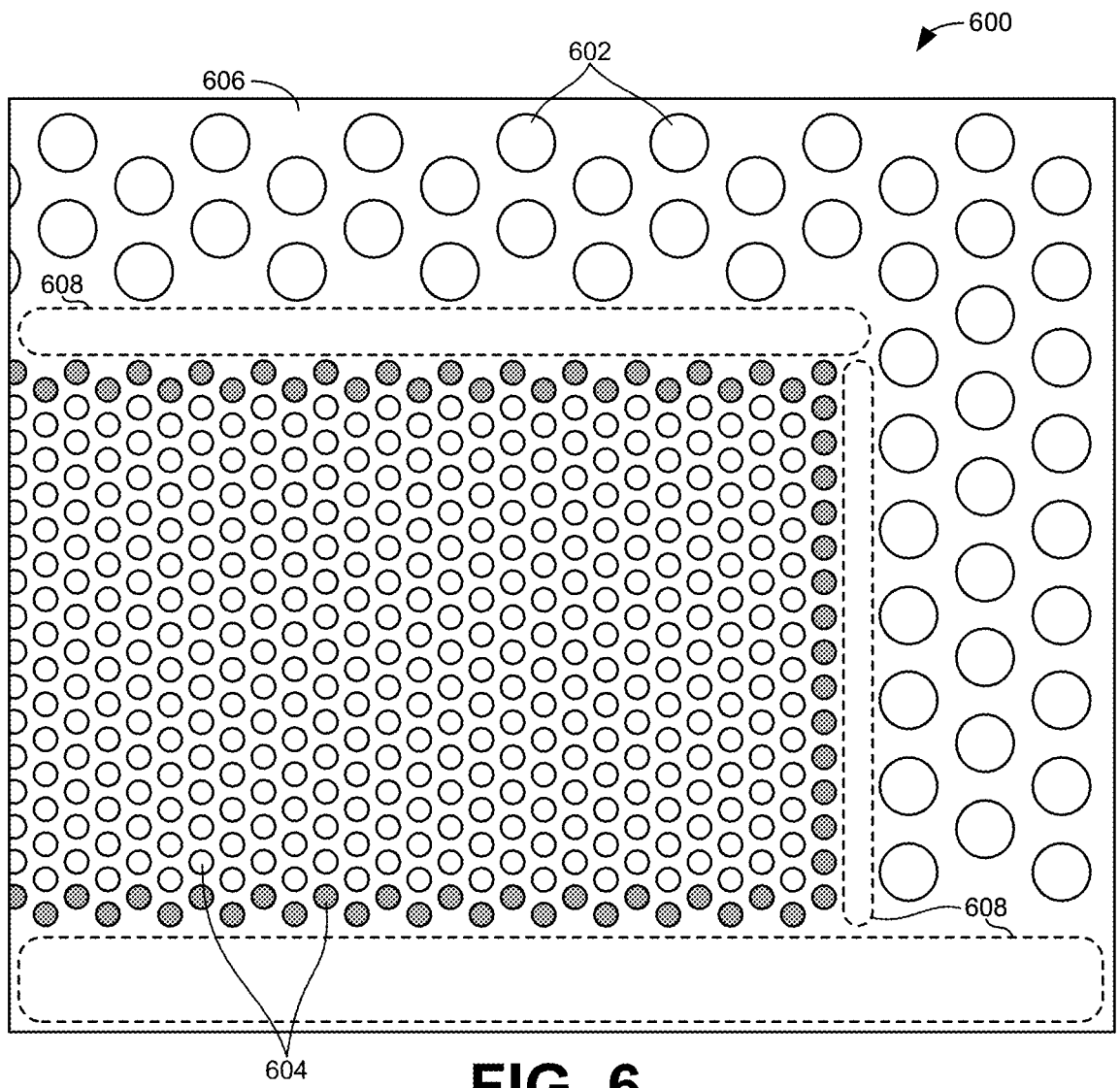
FIG. 6 is a plan view of a portion of a package substrate with an array of core bumps and an array of bridge bumps distributed across a surface 606 of the substrate.

FIG. 6 is a plan view of a portion of a package substrate 600 with an array of core bumps 602 and an array of bridge bumps 604 distributed across a surface 606 of the substrate 600. As shown in FIG. 6, the surface 606 includes open spaces 608 in which there are no bumps (either core bumps 602 or bridge bumps 604). More particularly, in this example, the open spaces 608 are adjacent an outer edge or perimeter of the array of bridge bumps 604. The area associated with the entire array of the bridge bumps is referred to herein as a bridge bump field. Typically, during the stripping process to remove the dry film resist that was used when forming the bumps 602, 604, the resist will first be removed in the interstitial spaces between the bumps 602, 604 before the resist is removed from the open spaces 608. Once the resist is removed from between the bumps 602, 604, the resist in the open spaces 608 can swell and push on the immediately adjacent bumps 602, 604. If the force is strong enough, the plated tin on the bumps 602, 604 can shift or shear as shown and described above in connection with FIGS. 2 and 3.

As noted above, bump shifting typically occurs due to swelling of the resist in open spaces 608. Therefore, bump shifting typically affects the bumps immediately adjacent the open spaces 608 (as shown in FIG. 2). Further, the direction of the shift is typically away from the adjacent open space 608 and towards the inner region of the bridge bump field (also shown in FIG. 2). Thus, in the illustrated example of FIG. 6, the bridge bumps 604 along the outer edge or perimeter of the bridge bump field (e.g., the bridge bumps 604 designated by the shading in FIG. 6) are at risk of being shifted during the stripping process. Notably, only the bridge bumps 604 are at risk of being shifted, and not the core bumps 602, because the core bumps 602 are sufficiently large to withstand the force produced by the swelling resist.

Figure 7:
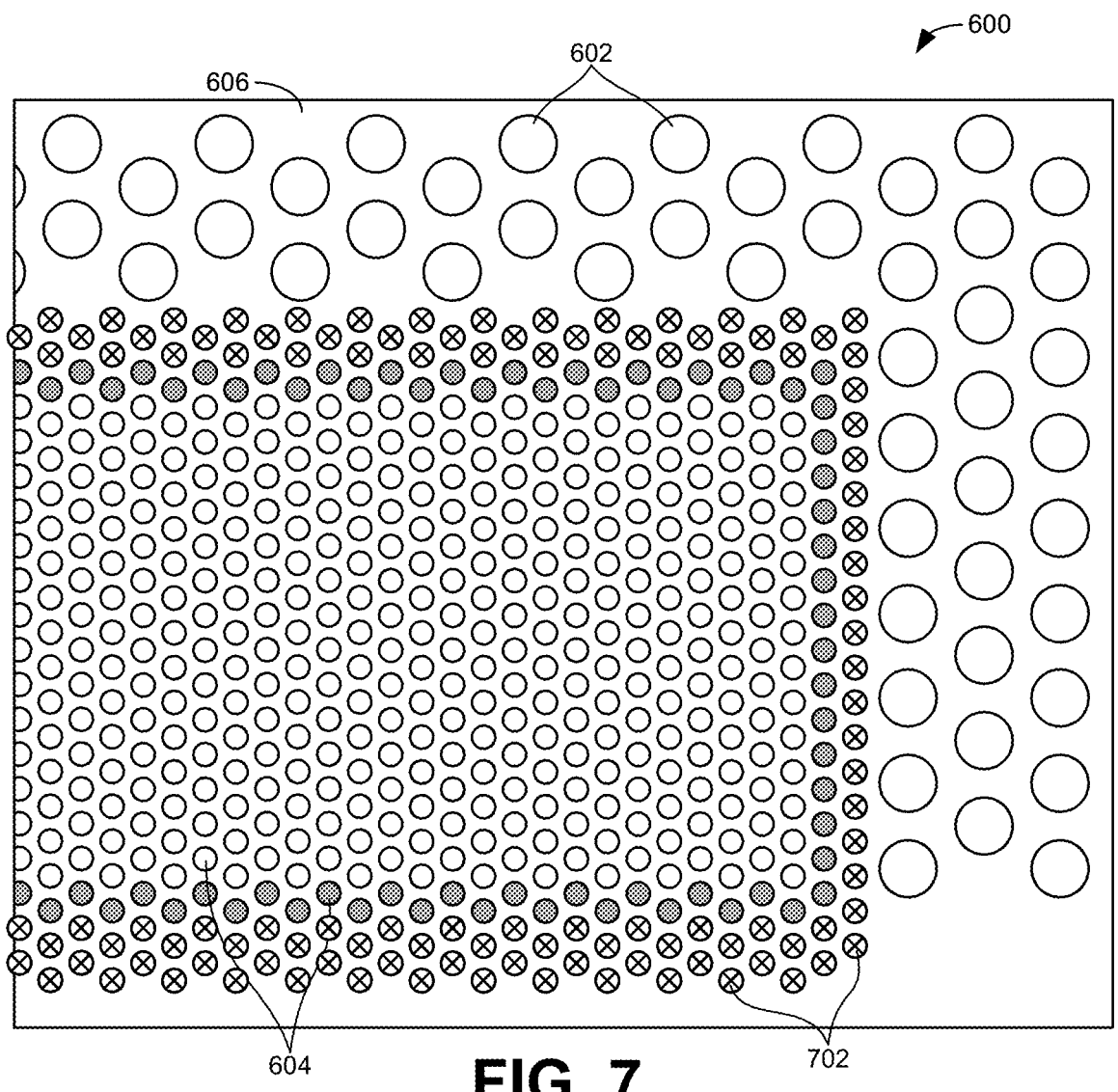
FIG. 7 is a plan view of the example package substrate of FIG. 6 that has been modified in accordance with teachings disclosed herein.

FIG. 7 is a plan view of the example package substrate 600 of FIG. 6 that has been modified in accordance with teachings disclosed herein. More particularly, in the illustrated example of FIG. 7, an array of dummy bridge bumps 702 (designated with an "x") are positioned adjacent the outer edge or perimeter of the operational bridge bumps 604 so as to fill in the open spaces 608 shown in FIG. 6. As used in this context, the terms "operational" is used to contrast with the term "dummy" when used to describe different types of bumps. Specifically, an "operational" bump is a bump that is intended to provide a conductive path for an electrical signal. In other words, an "operational" bump is a bump that is interconnected via electrical circuitry to associated components when an IC package containing the bump is to be used in operation. Operational bumps may alternatively be referred to as active bumps. Significantly, the use of the terms "active bump" or "operational bump" do not require the bumps to be actively in operation with power provided to the associated IC package containing the bumps. Rather, as used herein, these terms are intended to indicate that such bumps are capable of conveying electrical power and or signals in the event that the associated IC package is properly wired, powered, and in use. In contrast to the above definitions, a "dummy" bump is not electrically coupled to any component and, therefore, not capable of being used in operation. Rather, a "dummy" bump serves to protect the "operational" bumps from shifting during the dry film resist stripping process.

In the illustrated example of FIG. 7, the dummy bridge bumps 702 substantially fill the open spaces 608 shown in FIG. 6. However, in some examples, at least a portion of the open spaces 608 may remain so long as any remaining portion of the open spaces 608 is separated from the operational bridge bumps 604 by at least one row of dummy bridge bumps 702. In this manner, if the resist in the remaining open space swells and causes adjacent bumps to shift, the bumps that are shifted will be limited to the dummy bridge bumps 702, thereby protecting the operational bridge bumps 604. Furthermore, the dummy bumps 702 can provide the additional benefit of improving plating uniformity (e.g., the relative bump thickness variation (rBTV)) across the operational bridge bumps 604. In particular, the plating of bumps across a bump field array does not always result in perfectly uniform plating heights for all bumps. Rather, the plating height of the bumps near the edges or outer perimeter of the bump field is often somewhat shorter than rest of the bumps. By adding the dummy bridge bumps 702 that surround the operational bridge bumps 604, any thinning of the plating is less likely to occur in connection with the operational bridge bumps 604.

In the illustrated example of FIG. 7, the dummy bridge bumps 702 have the same size and shape as the operational bridge bumps 604 and are arranged in alignment with and as an extension or continuation of the packing geometry (e.g., hexagonal packing) of the operational bridge bumps 604. However, in other examples, the dummy bridge bumps 702 may be a different size (either larger or smaller) than the operational bridge bumps 604, may be a different shape than the operational bridge bumps 604 (e.g., non-circular), and/or may be arranged in a different manner (e.g., the dummy bumps may be arranged in a straight line along all sides of the bridge bump field rather than the staggard alignment corresponding to the hexagonal packing as shown in FIG. 7). Further, the number of rows of the dummy bridge bumps placed adjacent a particular edge of the bridge bump field can be any suitable number (e.g., 1, 2, 3, etc.) and may depend on the design and location of the operational bumps on the substrate and the size and location of the open spaces 608. Stated differently, in some examples, different numbers of the dummy bumps 702 are arranged in different lines extending away from the bridge bump field at different locations.

Figure 8:
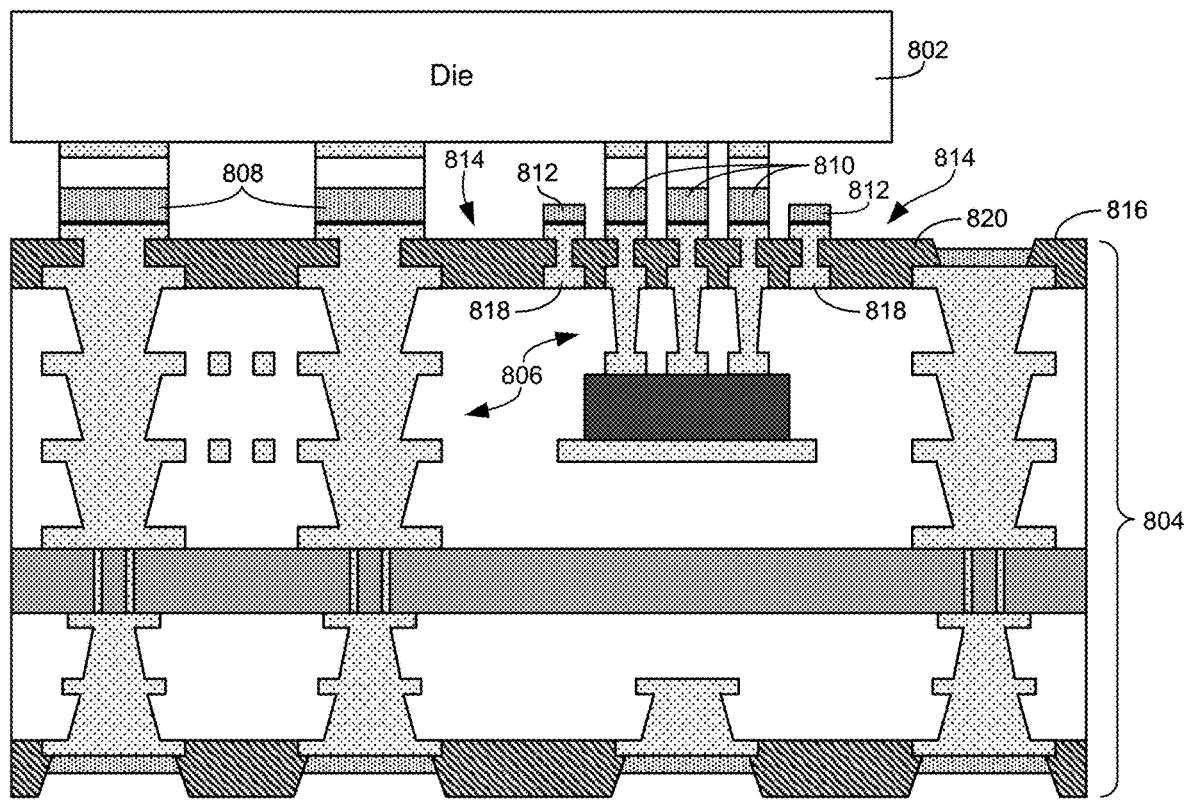
FIG. 8 illustrates an example die attached to a package substrate with dummy bumps constructed in accordance with teachings disclosed herein.

Furthermore, in some examples, the dummy bridge bumps 702 differ from the operational bridge bumps 604 in that the dummy bridge bumps 702 are constructed to be shorter than the operational bridge bumps 604. As discussed above, bump shifting becomes a greater concern as the height to diameter aspect ratio of the bumps increases. Thus, by reducing the height of the dummy bridge bumps 702, the shifting of the plated tin on such bumps becomes less likely while still providing protection for the operational bridge bumps 604. The dummy bridge bumps 702 being shorter than the operational bridge bumps 604 also keeps the dummy bridge bumps 702 spaced farther apart from a die when it is attached to the package substrate 600. This is shown in the cross-sectional view of FIG. 8. Specifically, FIG. 8 illustrates an example die 802 attached to a package substrate 804. In this example, the die 802 is electrically coupled to internal interconnects 806 of the package substrate 804 via core bumps 808 and operational bridge bumps 810. Further, as shown in the illustrated example, dummy bridge bumps 812 are positioned adjacent the operational bridge bumps 810 on the package substrate 804 so as to be between the operational bridge bumps 810 and open spaces 814 of the surface 816 of the package substrate 804. As used herein, an open space is any space on the surface 816 without bumps that extends a distance corresponding to at least the pitch of the operational bridge bumps 810.

In this example, the dummy bridge bumps 812 are anchored in place to the package substrate 804 via copper vias, interconnects, or pads 818 that extend through a passivation layer 820 of the substrate 804. However, as shown in FIG. 8, the copper vias, interconnects, or pads 818 associated with the dummy bridge bumps 812 are not electrically coupled to other interconnects within the substrate 804 and, therefore, are not electrically coupled to any other components (either in the package or external thereto). Further, as shown in the illustrated example of FIG. 8, the height of the dummy bridge bumps 812 is less than the height of the operational bridge bumps 810, thereby providing additional space between the dummy bumps 812 and the die 802. That is, as shown in the illustrated example, the dummy bumps 812 have a shorter height so that they do not form a connection that extends a full distance between the die 802 and the package substrate 804.

Figure 9:
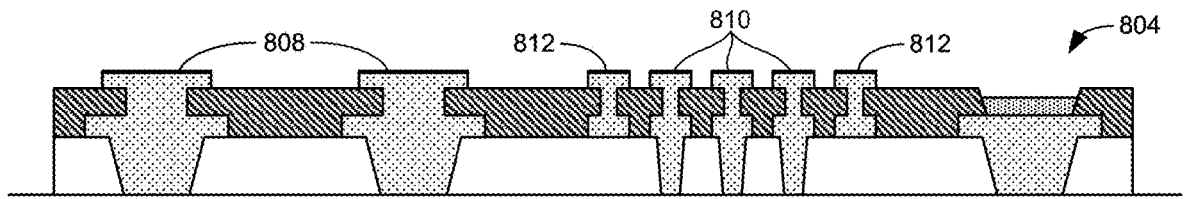
FIGS. 9-12 illustrate various stages in the fabrication process of the package substrate of FIG. 8 prior to attachment with the example die.
Figure 10:
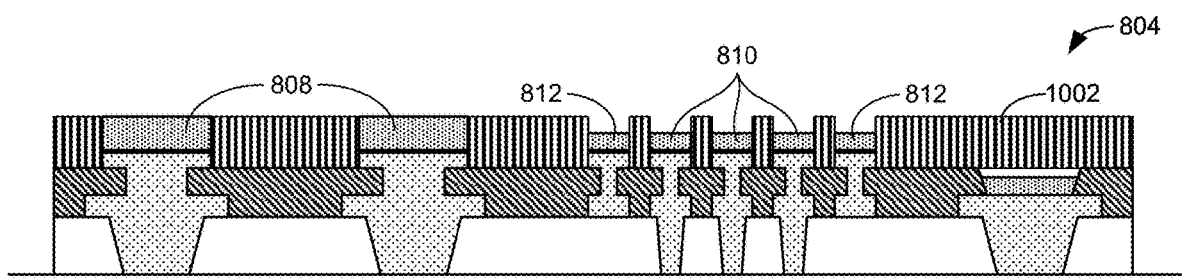
Figure 11:
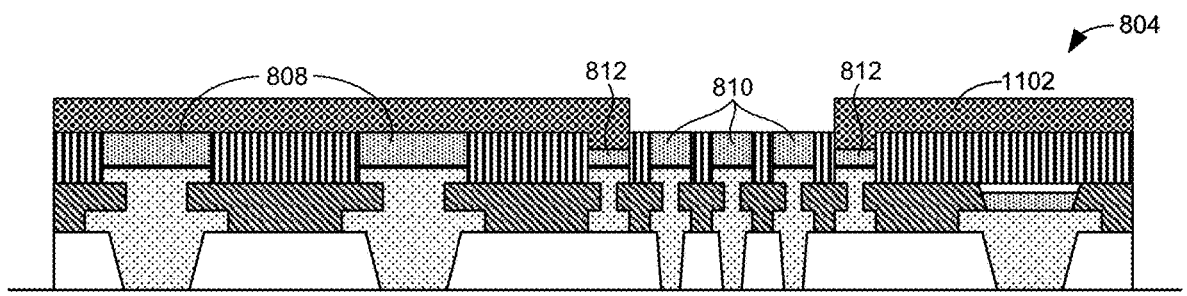
Figure 12:
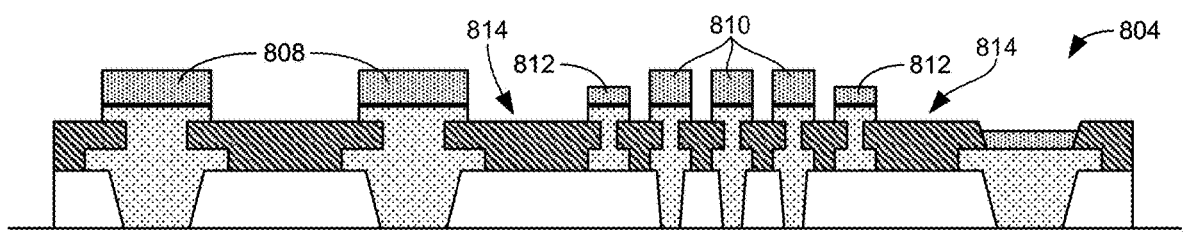

In some examples, the different heights of the operational and dummy bridge bumps 810, 812 is achieved through a two-stage plating process detailed in FIGS. 9-12. Specifically, FIG. 9 shows the upper portion of the package substrate 804 of FIG. 8 fabricated up to the point of the nickel barrier layer formed on the underlying copper that serves as the base for the various bumps 808, 810, 812 of the substrate 804. FIG. 10 shows a dry film resist 1002 added to the surface of the substrate 804 that has been patterned with openings that have been filled through a first tin plating process. In some examples, the amount of tin added in this first plating process defines the height of the dummy bridge bumps 812 (as well as the height of the core bumps 808). As shown in FIG. 11, a second layer of dry film resist 1102 is added to cover the core bumps 808 and the dummy bridge bumps 812 followed by a second tin plating process to increase the height of the operational bridge bumps 810. FIG. 12 shows the package substrate after the dry film resist layers have been removed through a stripping process. In this example, because the dummy bumps 812 are positioned adjacent the operational bridge bumps 810, any swelling of the resist in the open spaces 814 during the stripping process does not affect the operational bridge bumps 810.

Figure 13:
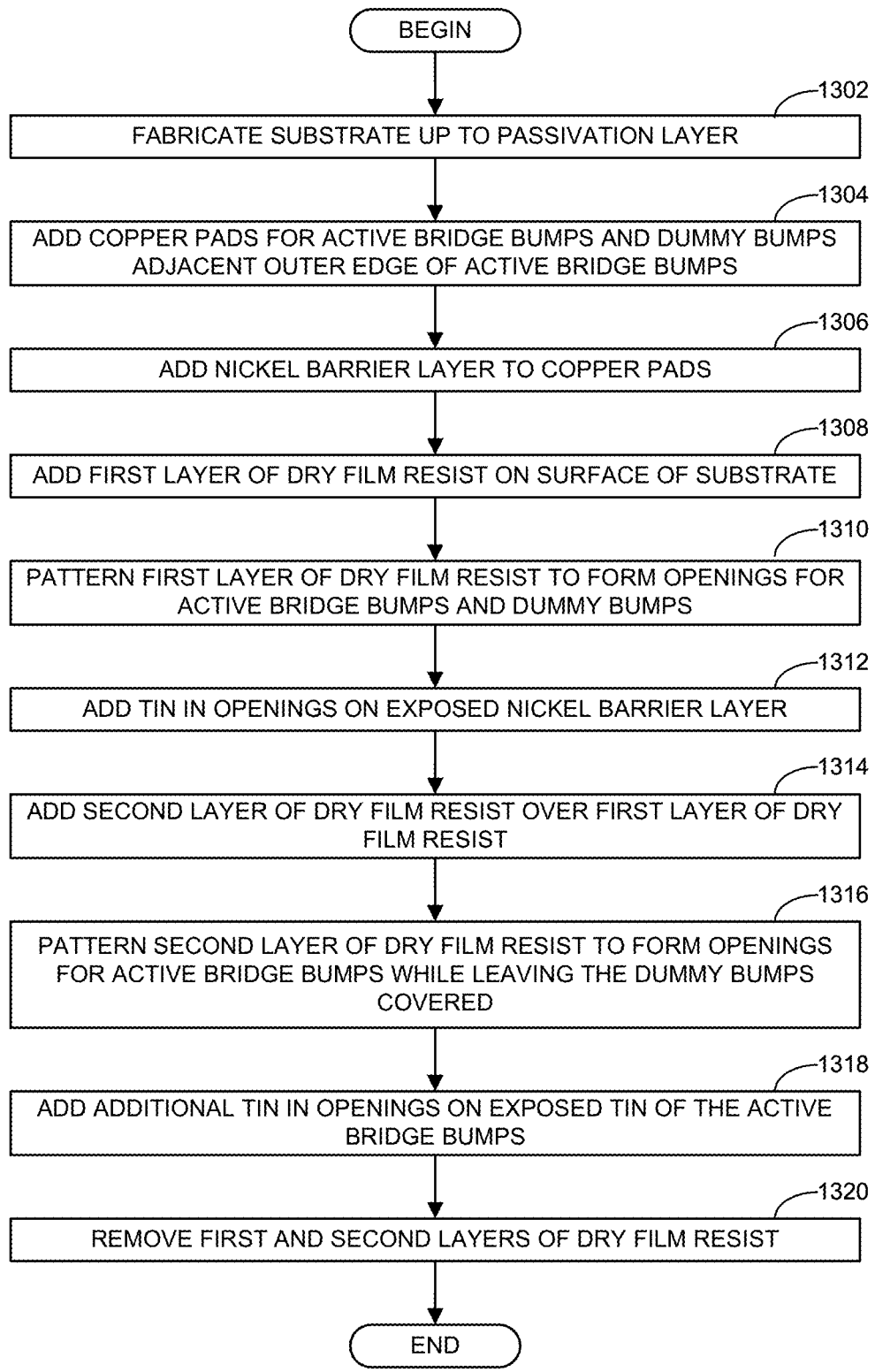
FIG. 13 is a flowchart illustrating an example method of manufacturing the package substrate of FIG. 8 up through the stage of completion shown in FIG. 12.

FIG. 13 is a flowchart illustrating an example method of manufacturing the package substrate 804 of FIG. 8 up through the stage of completion shown in FIG. 12. Although the example method of manufacture is described with reference to the flowchart illustrated in FIG. 13, many other methods may alternatively be used. For example, the order of execution of the blocks may be changed, and/or some of the blocks described may be combined, divided, re-arranged, omitted, eliminated, and/or implemented in any other way.

The example process begins at block 1302 by fabricating the substrate 804 up to the passivation layer 820. At block 1304, the example method includes adding (e.g., via plating or other suitable deposition process) copper pads for the operational bridge bumps 810 and dummy bumps 812 adjacent an outer edge of the operational bridge bumps 810. At block 1306, the example method includes adding (e.g., via plating or other suitable deposition process) a nickel barrier layer to the copper pads. The point of fabrication after completion of block 1306 corresponds to the package substrate 804 as shown in FIG. 9.

At block 1308, the method includes adding a first layer of dry film resist 1002 on the surface 816 of the substrate 804. At block 1310, the method includes patterning the first layer of dry film resist 1002 to form openings for the operational bridge bumps 810 and the dummy bumps 812. At block 1312, the method includes adding (e.g., via plating or other suitable deposition process) tin in the openings on the exposed nickel barrier layer. The point of fabrication after completion of block 1312 corresponds to the substrate 804 as shown in FIG. 10.

Figure 18:
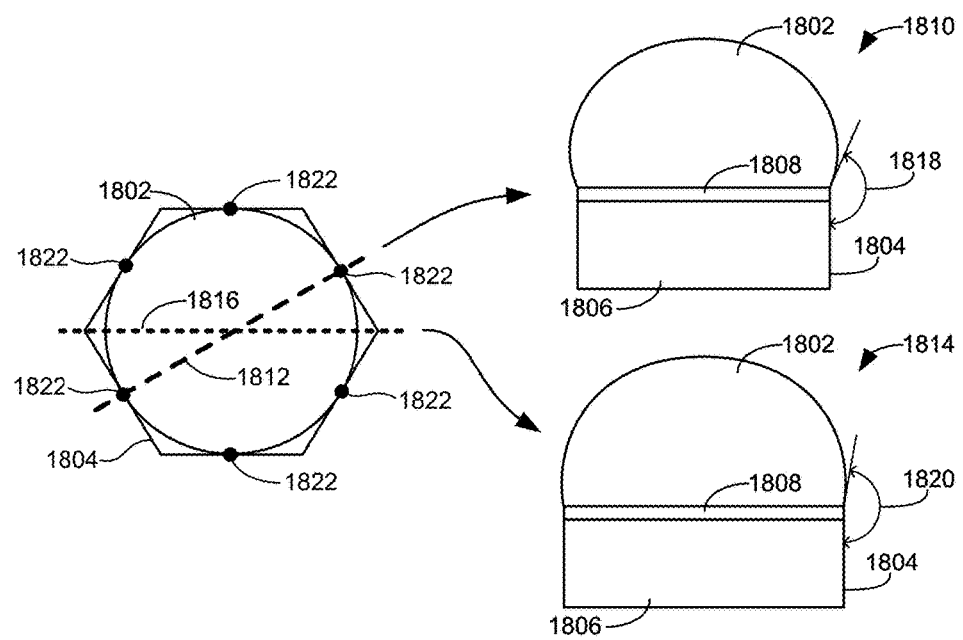
FIG. 18 illustrates two example profiles of tin on a hexagonal base of copper and nickel.

At block 1314, the method includes adding a second layer of dry film resist 1102 over the first layer of dry film resist 1002. At block 1316, the method includes patterning the second layer of dry film resist 1102 to form openings for the operational bridge bumps 810 while leaving the dummy bumps 812 covered. At block 1318, the method includes adding (e.g., via plating or other suitable deposition process) additional tin in the openings on the exposed tin of the operational bridge bumps 810. The additional tin added to the operational bridge bumps 810 results in the additional height being added to the operational bridge bumps 810 relative to the dummy bumps 812. The point of fabrication after completion of block 1318 corresponds to the package substrate 804 as shown in FIG. 18. At block 1320, the method includes removing the first and second layers of dry film resist 1002, 1102. Due to the inclusion of the dummy bumps 812, any swelling of the dry film resists 1002, 1102 will not cause any shifting of the tin on the operational bridge bumps 810. Once the layers of resist have been removed, the example process of FIG. 13 ends and the completed package substrate 804 (as shown in FIG. 12) can be further processed by, for example, attaching the die 802 shown in FIG. 8.

The discussion of FIGS. 6-13 have been described in connection with the implementation of dummy bumps 702, 812 on the package substrates 600, 804. However, in other examples, rather than being the substrate of a package, the substrates 600, 804 correspond to an underlying die onto which a separate die is attached. Further, in some examples, rather than fabricating dummy bumps on the underlying substrate (whether a package substrate or an underlying die), dummy bumps may alternatively be implemented adjacent operational bridge bumps on the separate die (e.g., the die 802 of FIG. 8) that attaches to the underlying substrate. Further, in some examples, both the underlying substrate and the attached die include dummy bumps that surround corresponding operational bridge bumps. More particularly, in some examples, whether dummy bumps are formed on an underlying substrate or an attached die depends on whether which or the two components includes plated tin. That is, in some examples, only one of the underlying substrate or the die includes bumps formed by plating tin to a copper/nickel base while the other components includes a copper/nickel base for a bump or pad without any tin added thereto. In such examples, only the component with the plated tin is at risk for shifted bumps and, as such, is the only component on which dummy bumps may be needed.

As discussed above in connection with FIG. 4, one potential defect that can occur when fabricating bumps on a die and/or a corresponding package substrate is that of tin wicking. Wicking involves the tin of the bumps falling off the edge of the copper/nickel base of the bumps during the tin reflow process. The probability of wicking occurring is related to the height to diameter (H/D) ratio of the plated tin (e.g., before reflow) of a bump. That is, as the H/D ratio increases, so does the likelihood of wicking. Thus, efforts to avoid wicking sometimes involve changes in design rules that reduce the H/D ratio by reducing the height of the plated tin. However, such efforts are no longer viable in view of design constraints calling for the scaling down of the pitch and associated size of the bumps. More particularly, reducing the H/D ratio for a bump that decreases in diameter necessarily involves the reduction in the total volume of tin including in the bump. Decreasing the volume of tin can negatively impact the reliability of solder joints formed with such tin. However, experimental testing has shown that forming the underlying copper and nickel layers in the base of a bump with a shape other than a circle (as is typical), a greater volume of tin can be maintained on the copper/nickel base when compared to a circle base. Additionally or alternatively, the same volume of tin as on a circle base can be maintained on a non-circular base with a smaller diameter thereby enabling smaller over all bump diameters to achieve smaller pitches than would be possible using a circle base.

Figure 14:
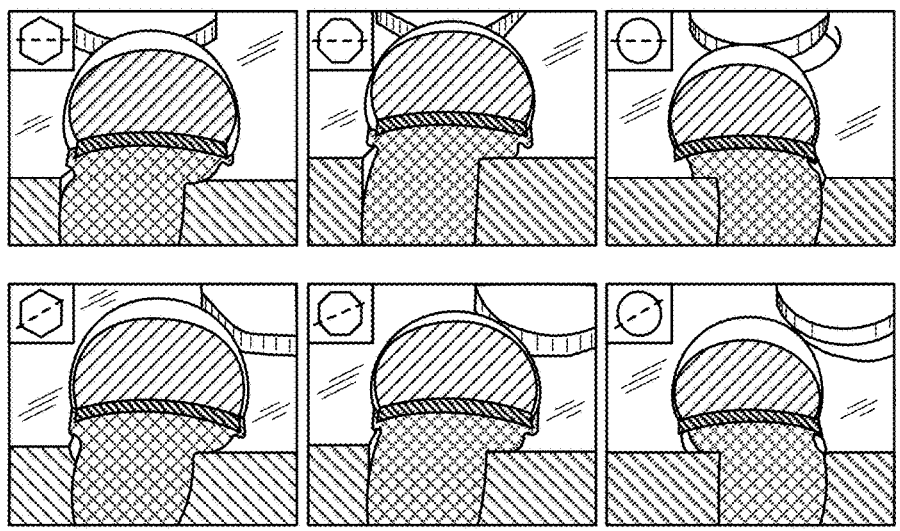
FIG. 14 is an illustration based on SEM images of bumps having copper/nickel bases with different shapes.

FIG. 14 shows illustrations based on SEM images of bumps having copper/nickel bases with different shapes. More particularly, the illustrations shown in FIG. 14 are angled views of hexagonal bumps, octagonal bumps, and circular bumps that have been cut in half to show a cross-section of the respective bumps. Further, different ones of the illustrations shown in FIG. 14 include bumps that are cut in two different directions including a first direction parallel to a surface (e.g., the inner surface 120 of FIG. 1) of the substrate on which the bumps are situated and a second direction parallel to the surface (e.g., the inner surface 120 of FIG. 1) of the substrate on which the bumps are situated. In this example, a first dimension of the bumps measured across the bumps in the first direction corresponds to a shortest dimension (from one side to an opposing side of the hexagonal and octagonal bumps) and a second dimension of the bumps measured across the bumps in the second direction corresponds to a longest direction (from one corner to an opposite corner of the hexagonal and octagonal bumps). As used herein, the shortest cross-sectional dimension of a regular polygon (such as a hexagon or octagon) is referred to herein as the inner diameter or smaller diameter of the polygon. By contrast, the longest cross-section direction of a polygon is also referred to herein as the outer dimeter or larger diameter of the polygon. The difference in size between the inner and outer diameters of a regular polygon depends on the number of sides and corresponding number of vertices or corners. For instance, the inner diameter of an octagon is more than 7% smaller than the outer diameter of the octagon, whereas the inner diameter of a hexagon is more than 13% smaller than the outer diameter of the hexagon. Thus, example bumps disclosed herein may have different cross-sectional dimensions that vary depending on the angle of the cross-section by a relatively significant margin (e.g., over 5%).

Figure 15:
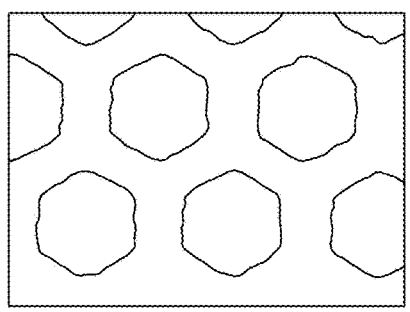
FIG. 15 is an illustration based on an SEM image of hexagonal core bumps prior to the reflow process showing that the tin is generally hexagonal in shape in accordance with teachings disclosed herein.
Figure 16:
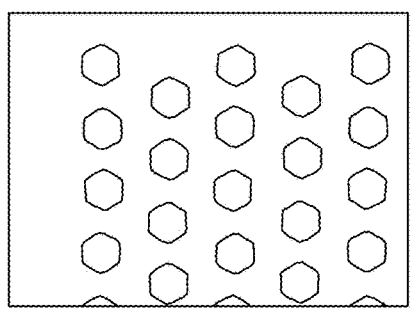
FIG. 16 is an illustration based on an SEM image of hexagonal bridge bumps prior to the reflow process showing that the tin is generally hexagonal in shape in accordance with teachings disclosed herein.
Figure 17:
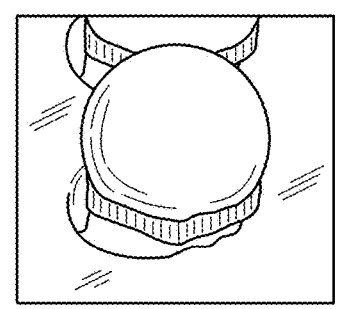
FIG. 17 is an illustration based on an SEM image of a hexagonal bump after the reflow process to show that, although the tin is round or bulbous, the underlying copper/nickel base retains a generally hexagonal shape.

Notably, the bumps cut in FIG. 14 are after the reflow process. As a result, while the underlying copper/nickel layers have the different shapes as noted above, the tin in each case is generally round or bulbous. The round or bulbous shape of the tin arises from the surface tension of the tin when it melts during the reflow process. Prior to the reflow process, the tin also has a shape corresponding to the underlying copper/nickel base. For instance, FIG. 15 is an illustration based on an SEM image of a plan or top view of hexagonal core bumps prior to the reflow process showing that the tin is generally hexagonal in shape. Similarly, FIG. 16 is an illustration based on an SEM image of a plan or top view of hexagonal bridge bumps prior to the reflow process showing that the tin is generally hexagonal in shape. FIG. 17 is an illustration based on an SEM image of an angled view of a hexagonal bump after the reflow process to show that, although the tin is round or bulbous, the underlying copper/nickel base retains a generally hexagonal shape.

While the shape of the tin after reflow is generally round or bulbous, the particular profile of the bulbous shape is affected by the shape of the underlying base. This is diagrammatically shown in FIG. 18. In particular, FIG. 18 illustrates two example profiles of tin 1802 on a hexagonal base 1804 of copper 1806 and nickel 1808. The two profiles shown in FIG. 18 correspond to two different cross-sectional views of the bump including a first cross-section 1810 taken along the shortest dimension 1812 of the hexagonal base 1804 (e.g., extending between opposing sides of the hexagonal base 1804) and a second cross-section 1814 taken along the longest dimension 1816 of the hexagonal base 1804 (e.g., extending between opposing corners of the hexagonal base 1804). As shown in the illustrated example, an angle 1818 of the tin 1802 relative to the sidewall of the hexagonal base 1804 in the first cross-section 1810 is less than an angle 1820 of the tin 1802 relative to the sidewall of the hexagonal base 1804 in the second cross-section 1814. In other words, the profile of the tin 1802 overhangs the sidewall of the hexagonal base 1804 by a greater extent at the midpoints 1822 of each side of the hexagonal base 1804 than the tin 1802 overhangs the corners of the hexagonal base 1804. This is expected because, as shown in FIG. 18, a perfectly round droplet of tin 1802 having a diameter corresponding to the inner diameter of the hexagonal base 1804 would extend to the midpoints 1822 of the hexagonal sides but remain spaced apart from and within the corners of the hexagonal base 1804. By contrast, in typical bumps, which have a circular copper/nickel base, a perfectly round droplet of tin would extend to the edge of the circular base along the entire circumference of the base. As a result, any point along the entire circumference of a circular base can be a location giving rise to a relatively high risk for the onset of wicking in which melted tin falls off the edge of the bump base. However, for the hexagonal base 1804 shown in FIG. 18, the locations of highest risk for wicking are reduced to six points corresponding to the midpoints 1822 of the sides of the hexagonal base 1804.

Figure 19:
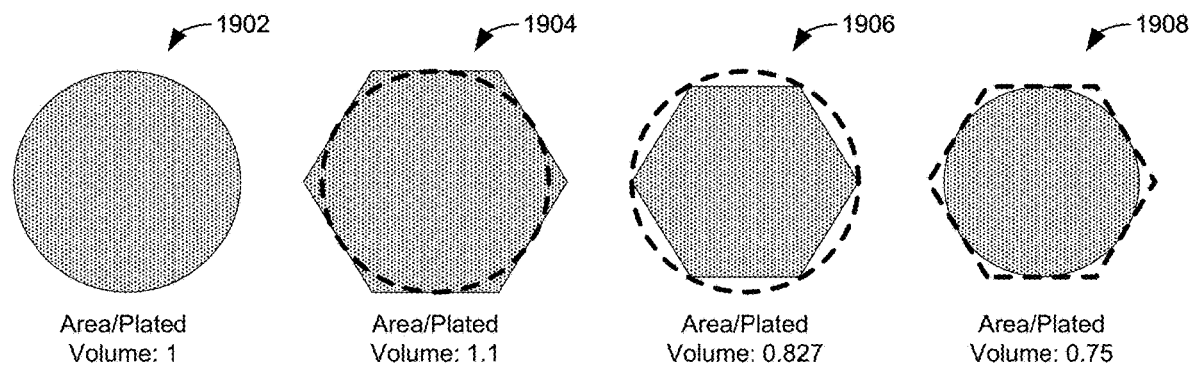
FIG. 19 illustrates comparative areas and volumes of plated tin on different circular and hexagonal bumps.

The advantages of a hexagonal base relative to a standard circular base is further detailed in FIG. 19, which compares different hexagonally shaped bumps relative to similarly sized circular bumps. In FIG. 19, the shaded areas in each of the four diagrams 1902, 1904, 1906, 1908 represent the plated area of tin. Thus, the first and last diagrams 1902, 1908 correspond to circular bumps, whereas the second and third diagrams represent hexagonal bumps. For purposes of explanation, the circular bump of the first diagram 1902 is a reference bump to which each of the other three diagrams are compared. Accordingly, as shown in FIG. 1, the ratio of the area of the plated tin to the volume of the tin is normalized to 1. The dashed circle in the second diagram 1904 of FIG. 19 is the same size as the reference circular bump in the first diagram 1902 and is provided for purposes of comparison. As shown in the second diagram 1904, the inner diameter of the hexagon is equal to the diameter of the reference circular bump shown in the first diagram 1902. Because this critical dimension of the hexagonal bump is equal to the diameter of the reference circle, hexagonal bumps represented by the second diagram 1904 can be distributed with the same pitch as would be possible for the reference circular bump. However, as shown in the illustrated example, the area of the plated tin extends beyond the circumference of the reference circle (e.g., at the corners of the hexagon) such that a greater amount of tin can be included on the bump. More particularly, as indicated in FIG. 19, the ratio of the area of the plated tin to the volume of the tin in the second diagram is 1.1 (relative to the reference circular bump). Thus, by using hexagonal bumps in lieu of circular bumps a 10% increase in the area to volume ratio for bumps at a constant pitch can be achieved.

As described above, there are ongoing efforts to reduce the size of bumps and the corresponding pitch or spacing of the bumps. The third diagram 1906 represents a hexagonal bump that has been reduced in size relative to the hexagonal bump of the second diagram 1904. More particularly, the hexagonal bump of the third diagram 1906 is reduced in size so that its outer diameter is equal to the diameter of the reference circular bump of the first diagram 1902 and represented by the dashed circle in the third diagram 1906. As shown in the illustrated example, this reduction in size results in a ratio of the area of the plated tin to the volume of the tin being 0.827. By contrast, the fourth diagram 1908 represents a circular bump that has been reduced in size relative to the reference circular bump of the first diagram 1902 by the same extent that the hexagonal bump of the third diagram 1906 was reduced in size. That is, as shown in the illustrated example, the circular bump of the fourth diagram 1908 has a diameter corresponding to the inner diameter of the hexagonal bump of the third diagram 1906 as represented by the dashed hexagon in the fourth diagram 1908. Inasmuch the circular bump in the fourth diagram 1908 has the same critical dimension as the hexagonal bump of the third diagram 1906, these bumps can be distributed at a similar pitch (in the same way the bumps of the first and second diagrams 1902, 1904 can be spaced at the same pitch). However, as indicated in FIG. 19, the ratio of the area of the plated tin to the volume of the tin for the circular bump represented by the fourth diagram 1908 is 0.75. Thus, although the bumps in both the third and fourth diagrams 1906, 1908 of FIG. 19 are reduced in size by the same amount, the area to volume ratio of the hexagonal bump of the third diagram 1906 is approximately 10% greater than the circular bump of the fourth diagram 1908. In other words, hexagonal bumps provide the ability to achieve higher volumes of tin at a given pitch than is possible with standard circular bumps. Alternatively, hexagonal bumps can be designed to be slightly smaller for a reduced pitch relative to what is possible for circular bumps that have the same volume of tin.

Figure 20:
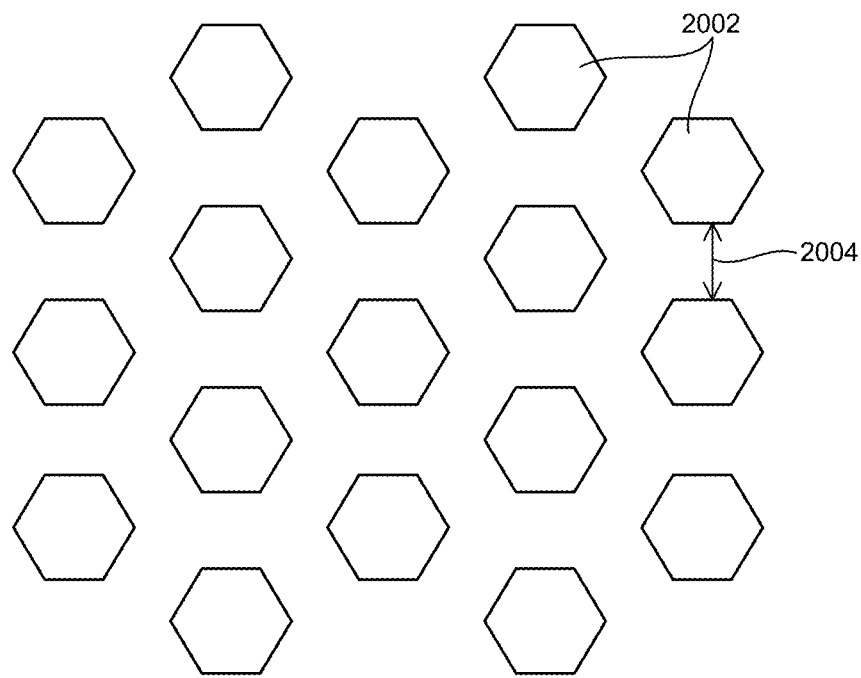
FIG. 20 illustrates an example array of hexagonal bumps arranged in a hexagonal grid with each bump in a first example orientation.
Figure 21:
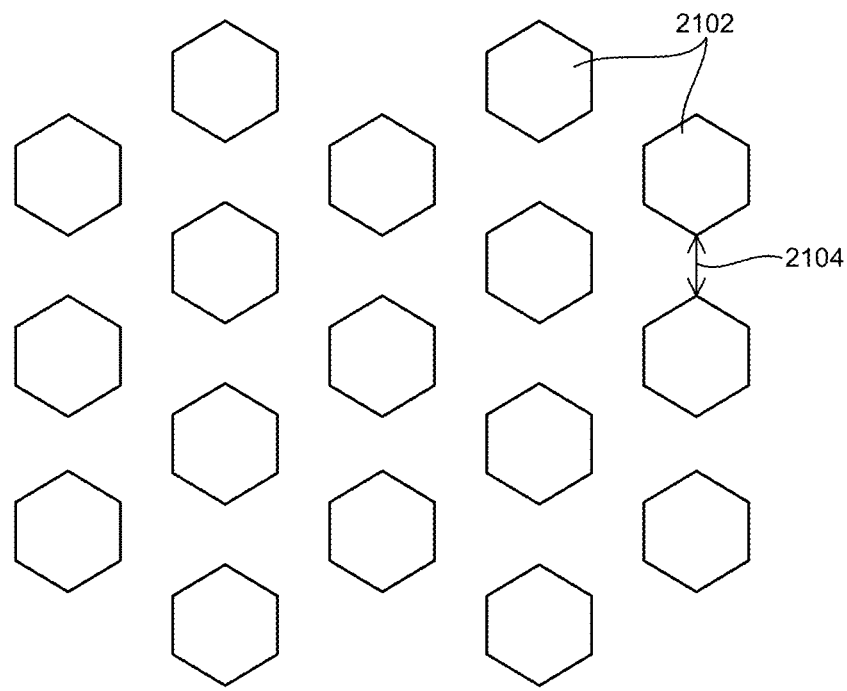
FIG. 21 illustrates an example array of hexagonal bumps arranged in a hexagonal grid with each bump in a second example orientation.

The reason that hexagonal bumps can be spaced at the same pitch as circular bumps having a diameter corresponding to the shortest dimension (e.g., the inner diameter) of the hexagonal bump is made apparent with reference to FIG. 20. In particular, FIG. 20 illustrates an example array of hexagonal bumps 2002 arranged in a hexagonal grid with a shortest distance 2004 between adjacent ones of the bumps 2002 extending between facing sides of the adjacent hexagonal bumps 2002 in a direction normal to the facing sides. In some examples, the shape of the bumps is designed to match the packing geometry of the bumps. For instance, in the illustrated example, the shape of the bumps (hexagonal) matches the packing geometry (hexagonal) of the array of bumps. As another example, a square shape of bumps may be implemented for a square packing geometry. In other examples, the shape does not match the packing geometry. In the illustrated example of FIG. 20, the shortest distance 2004 between adjacent bumps 2002 is the same distance that would be between adjacent circular bumps of the same size such that the bumps in both cases can have a similar pitch. FIG. 21 illustrates another example array of hexagonal bumps 2102 arranged in a hexagonal grid with a shortest distance 2104 between adjacent ones of the bumps 2102 extending between the corners of the adjacent hexagonal bumps 2102. In other words, the corners of a given bump in FIG. 21 point toward the corners of the closest adjacent bumps, whereas the corners of a given bump in FIG. 20 point between the closest adjacent bumps. Notably, the shortest distance 2104 between the hexagonal bumps 2102 in FIG. 21 is smaller than the shortest distance 2004 between the hexagonal bumps 2002 in FIG. 20. As a result, the size of the hexagonal bumps 2102 of FIG. 21 may need to be somewhat smaller than the size of the hexagonal bumps 2002 of FIG. 20. However, the size of the hexagonal bumps 2102 of FIG. 21 should not need to be as small as circular bumps that are spaced by the same shortest distance 2104. Further, the spacing of the hexagonal bumps 2102 of FIG. 21 should need to be as far as the spacing of circular bumps that are dimensioned with a diameter corresponding to the outer diameter of the hexagonal bumps 2102. The smaller size and/or smaller spacing of the hexagonal bumps 2102 of FIG. 21 is possible because is because the tin at the corners of the hexagonal bumps 2102 overhangs the underlying copper/nickel base less than the midpoints 1822 as shown and described above in connection with FIG. 18. As a result, the points of most likely wicking of the tin is at the midpoints 1822, which are spaced farther apart in FIG. 21 than in FIG. 20.

Although FIGS. 18-21 show hexagonally shaped bumps, bumps may be formed (using standard lithographic patterning) in any suitable shape that is non-circular to achieve some of the benefits disclosed herein. Such non-circular shapes include shapes having at least one straight side. In some examples, the non-circular shapes correspond to polygons with a plurality of straight sides (e.g., triangles, squares, pentagons, hexagons, octagons, etc.). More particularly, in some examples, the polygons correspond to regular polygons (e.g., polygons where each side is the same length and the angle at each corner is the same). In some examples, different shapes may be used for different bumps on a die and/or the corresponding package substrate. In some examples, the different shapes may correspond to different bumps within a single array of bumps (e.g., the bumps alternate between hexagons and triangles). In other examples, the different shapes may correspond to bumps in distinct arrays (e.g., an array of core bumps have a first shape while an array of bridge bumps have a second different shape). In short, the shape of the bumps can be designed in any suitable matter (with each bump being the same or different as appropriate) to achieve design requirements associated with the pitch and/or spacing of the bumps, the orientation of the bumps so spaced, the critical (shortest) dimension (e.g., diameter in the context of a circular bump and distance between opposing sides in the context of a hexagonal bump), the longest dimension (e.g., distance between corners in a hexagonal bump), the interfacial area of the copper/nickel base, and the tin plating volume.

The above parameters can be selected and/or designed to reduce the risk of wicking relative to comparatively sized circular bumps. Additionally or alternatively, the above parameters can be selected and/or designed to increase tin volume for a given pitch relative to comparatively sized circular bumps. Additionally or alternatively, the above parameters can be selected and/or designed to reduce the size of bumps while maintaining the same tin volume relative to comparatively sized circular bumps. In some such examples, the pitch between the smaller bumps can also be maintained to provide more space between adjacent bumps (thereby reducing the likelihood of connective bridges forming between the bumps). In other examples, the smaller size of bumps can enable the reduction in pitch of the bumps. Additionally or alternatively, the above parameters can be selected and/or designed to reduce the bump height while maintaining the same volume (thereby reducing the H/D ratio, which in turn reduces the likelihood of bumps shifting during dry film resist stripping).

Figure 22:
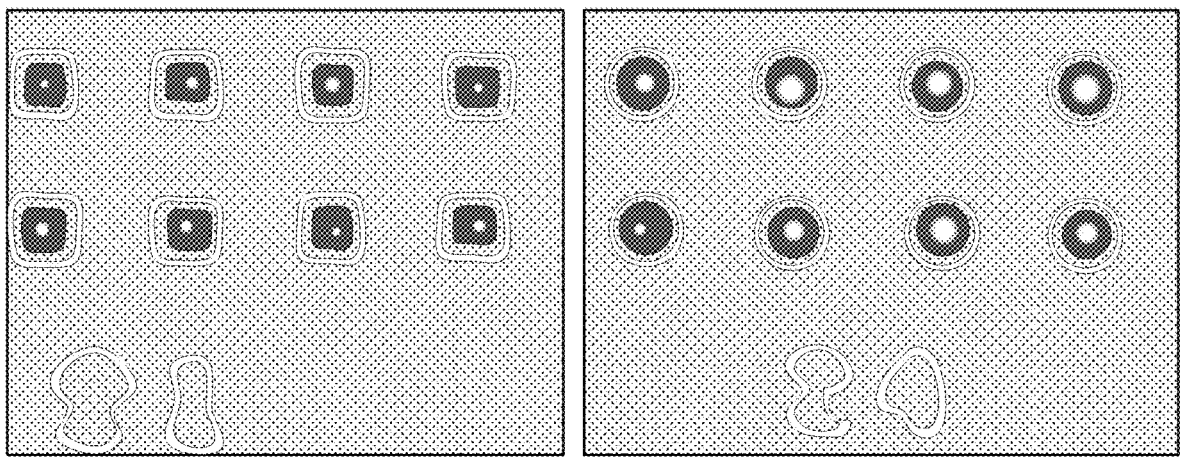
FIG. 22 shows illustrations based on SEM images of a plan view of an array of square bumps juxtaposed with a plan view of an array of circular bumps.

Another advantage to implementing bumps with polygonal shapes is that the reduced number of sides (relative to a circle which is comparable to a polygon with an infinite number of sides) is that such bumps have higher optical resolution. The higher resolution of non-circular shapes arises from the fact that such shapes do not give concentrated light from all directions as is the case with a circular shape. This is shown in FIG. 22 where the image at the left is an illustration based on an SEM image of a photoresist that shows a resolution of 20 µm using a square shape, whereas the image at the right is an illustration based on an SEM image of a photoresist that shows a resolution of only 23 µm using a circular shape.

Figure 23:
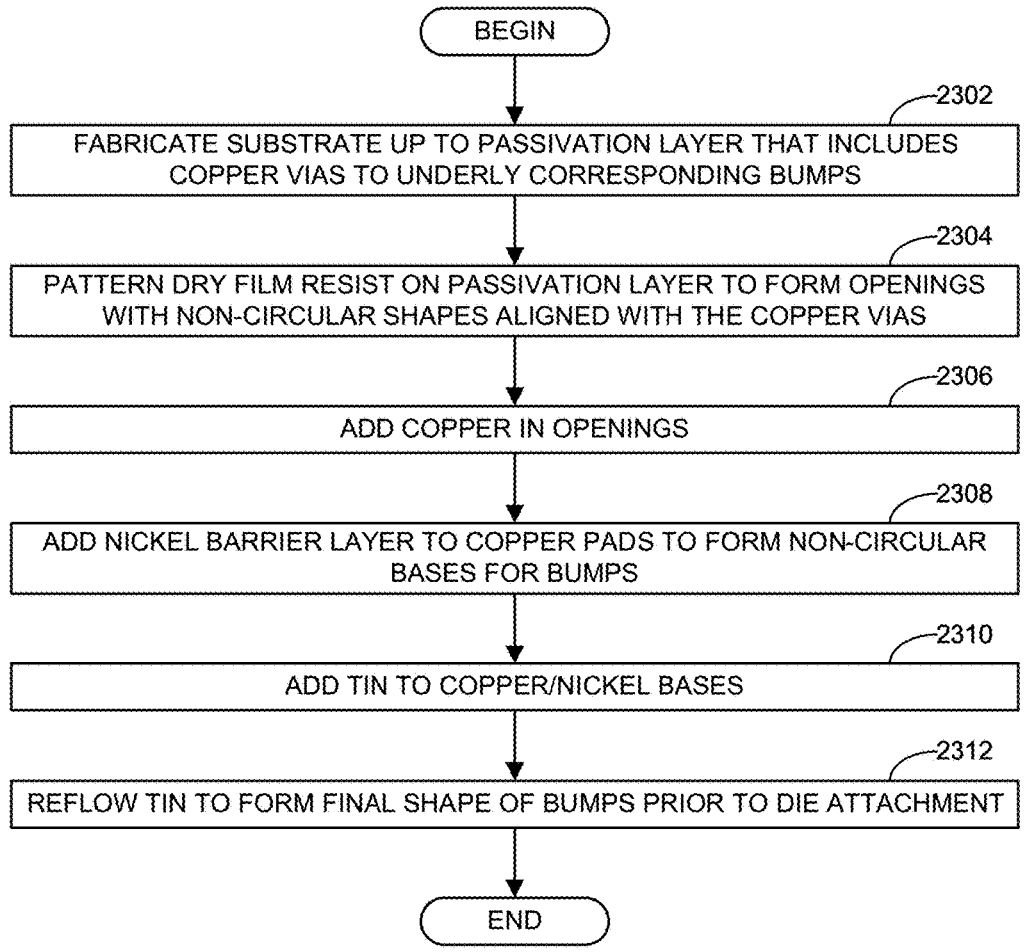
FIG. 23 is a flowchart illustrating an example method of manufacturing an example substrate with non-circular bumps in accordance with teachings disclosed herein.

FIG. 23 is a flowchart illustrating an example method of manufacturing a substrate (e.g., the package substrate 110 of FIG. 1) with non-circular bumps as described above in connection with FIGS. 14-22. Although the example method of manufacture is described with reference to the flowchart illustrated in FIG. 23, many other methods may alternatively be used. For example, the order of execution of the blocks may be changed, and/or some of the blocks described may be combined, divided, re-arranged, omitted, eliminated, and/or implemented in any other way.

The example process begins at block 2302 by fabricating the substrate 110 up to a passivation layer that includes copper vias to underly corresponding bumps. In some examples, the copper vias are circular in shape (e.g., circular pillars extending through the passivation layer). At block 2304, the method includes patterning a dry film resist on the passivation layer to form openings with non-circular shapes aligned with the copper vias. As discussed above, the shapes of the openings can be any suitable shape. In some examples, different shapes may be used for different ones of the bumps on the substrate 110. Further, in some examples, the package substrate may include circular shapes in addition to non-circular shapes. At block 2306, the example method includes adding (e.g., via plating or other suitable deposition process) copper in the openings. At block 2308, the example method includes adding (e.g., via plating or other suitable deposition process) a nickel barrier layer to the copper pads to form non-circular bases for bumps. At block 2310, the example method includes adding tin to the copper/nickel bases. In some examples, the addition of tin is done through a similar plating deposition process such that the tin will take the same non-circular shape as the underlying copper/nickel base. However, at block 2312, the method includes reflowing the tin to form a final shape of the bumps prior to die attachment. That is, through the reflow process, the tin will melt and convert into a general round or bulbous shape due to the surface tension of the melted tin. However, the copper/nickel base will retain the non-circular shape. Thereafter, the example method of FIG. 23 ends and the end product can be used for further processing (e.g., by attaching an associated die).

Although the method of FIG. 23 is described with the fabrication of non-circular bumps on a package substrate, the method can similarly be applied to the fabrication of bumps on a die. More generally, the discussion of FIGS. 14-23 regarding the fabrication of non-circular bumps applies to any types of bumps. Thus, both core bumps and bridge bumps can be fabricated with non-circular shapes. Further, the discussion of FIGS. 14-23 have been described in connection with the implementation of non-circular bumps on the package substrates 100. However, in other examples, rather than forming non-circular bumps on the substrate of a package, non-circular bumps can be fabricated on an underlying die onto which a separate die is attached. Further, in some examples, rather than fabricating non-circular bumps on the underlying substrate (whether a package substrate or an underlying die), non-circular bumps may alternatively be formed on the separate die (e.g., the dies 106, 108 of FIG. 1) that attach to the underlying substrate. Further, in some examples, both the underlying substrate and the attached die include non-circular bumps. In some such examples, the shapes of corresponding bumps and/or pads on both interfacing components match. In other examples, mating ones of the bumps and/or pads on the interfacing components may have different shapes relative to one another. Further, in some examples, teachings disclosed in connection with FIGS. 14-23 may be combined with teachings disclosed in connection with FIGS. 6-13. That is, in some examples, the dummy bumps discussed in connection with FIGS. 6-13 may have non-circular shapes as discussed in connection with FIGS. 14-23.

As discussed above in connection with FIG. 5, one potential defect that can occur when fabricating bumps on a die and/or a corresponding package substrate (or underlying die) is a lack of co-planarity across the array of bumps due to warpage in the die and/or the substrate. In some instances, such warpage arises from the fabrication of the die and/or the substrate individually. Additionally or alternatively, such warpage can arise during the TCB process when the bumps and/or pads on the die and the underlying substrate are bonded together. In some examples, where the nature of the warpage can be anticipated, the bumps on the die and/or package substrate are fabricated to have different heights that compensate for regions on the die and/or the substrate that jut outward or recess inward due to the warpage. More particularly, in some examples, the different heights of the bumps is achieved by fabricating the bumps with different diameters or widths.

Figure 24:
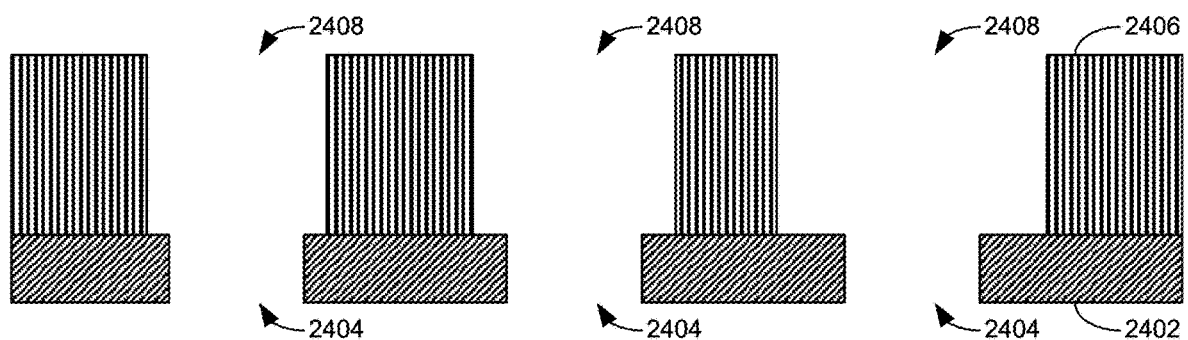
FIGS. 24-26 illustrate various stages in the fabrication process of bumps with different heights that vary spatially across the surface of the underlying substrate in accordance with teachings disclosed herein.
Figure 25:
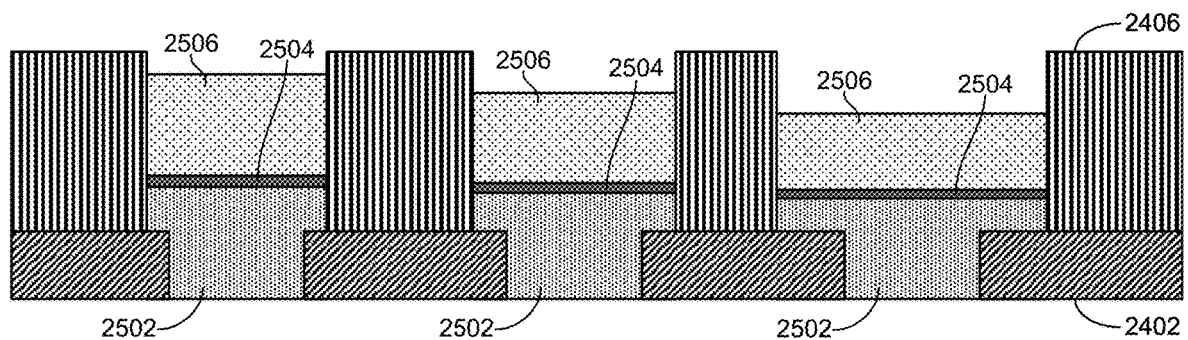
Figure 26:
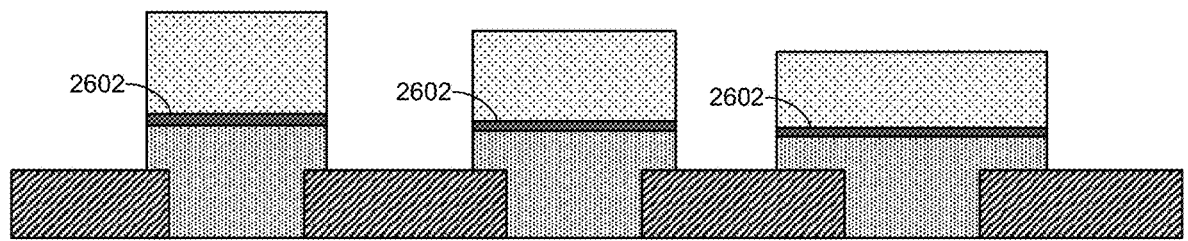

FIGS. 24-26 illustrate three stages in the fabrication process of bumps with different heights. In particular, FIG. 24 illustrates a passivation layer 2402 of a substrate that has been lithographically patterned to form a series of openings 2404 prior to the plating of copper therein. In some examples, the substrate corresponds to the substrate 110 of the package 100 of FIG. 1. FIG. 24 illustrates a dry film resist 2406 (on the passivation layer 2402) that has been patterned with a series of openings 2408 aligned with the openings 2404 in the passivation layer 2402. In this example, the diameter or width of all three openings 2404 in the passivation layer are the same size. By contrast, the diameter or width of each of the openings 2408 in the dry film resist 2406 has a different size than the other two openings 2408. More particularly, in this example, the leftmost opening 2408 has the smallest diameter of the three, the rightmost opening 2408 has the largest diameter of the three, with the center opening 2408 having a diameter that is between the other two.

The plating process by which copper, nickel, and tin are added into the openings 2404, 2408 controls the volume of the material added. That is, each of the openings 2404, 2408 will be plated with approximately the same amount of copper, approximately the same amount of nickel, and approximately the same amount of tin. Inasmuch as the volume or amount of metal added into each opening 2404, 2408 is constant, the change in diameter or width of the openings 2404, 2408 affects the thickness or height of each layer of metal. More particularly, a smaller diameter opening will result in a taller plating height, whereas a larger diameter will result in a shorter plating height. This is shown in FIG. 25, which shows copper 2502 filling the openings 2404 of the passivation layer 2402 and extending upward into the openings 2408 in the dry film resist. In this example, the copper 2502 extends to a greater height in the leftmost opening 2408 than the other openings because of the smaller diameter leftmost opening. A nickel barrier layer 2504 is added to copper 2502 in each of the openings 2408. As shown in the illustrated example, the thickness of the nickel barrier layer 2504 is greatest for the leftmost opening 2408 and least for the rightmost opening 2408 because of the different diameters of each opening. Finally, tin 2506 is added on the nickel barrier layer 2504 with the thickness or height of the tin 2506 differing between each opening 2408 based on the different diameters of each opening 2408. FIG. 26 illustrates the resulting bumps of three differing heights after the removal of the dry film resist 2406. Notably, not only is the overall height (relative to an upper surface of the passivation layer 2402) of the bumps different but the height of an interface 2602 between the nickel barrier layer 2504 and the tin 2506 also varies in height across the different bumps due to the different thickness of the copper and nickel in the base of the bumps.

An advantage of adjusting the height of bumps based on modulating the diameter or width of the openings 2408 is that it only involves a redesign of the mask used to pattern the openings without affecting other fabrication processing operations. For instance, adjusting the diameter or size of the openings as disclosed herein enables the plating operations to be controlled independently and performed as they would be in the past including the particular plating height used for core bumps in contrast with the plating height used for bridge bumps.

In the illustrated example of FIGS. 24-26, the openings 2404 in the passivation layer 2402 have a consistent diameter or width. However, in other examples, the openings 2404 in the passivation layer 2402 may also differ from one opening 2404 to another. In some such examples, the extent of the difference between the openings 2404 is proportionate to differences in the size of the openings 2408 in the dry film resist 2406. In other examples, the size of the openings 2404 in the passivation layer 2402 differ in a manner that is independent of the different sizes of the openings 2408 in the dry film resist 2406. Further, in the illustrated example of FIGS. 24-28, a central axis of the openings 2404, 2408 are spaced apart at a consistent pitch. However, in other examples, the pitch between adjacent bumps may differ at different locations on a substrate to provide more or less space between bumps depending on whether the diameter or width of the bumps is larger or smaller (to produce a corresponding shorter or taller bump).

As shown in the illustrated example, by adjusting or modulating the size of each opening (which can be precisely controlled through known lithography techniques), it is possible to define different bump heights spatially across an array of bumps (e.g., a particular bump field) to compensate for expected forms of warping in the package substrate and/or corresponding die across the area of the substrate corresponding to the area of the array of bumps. Spatially modulating the height of bumps across an area of a die and/or package substrate can also compensate for other types of known defects. That is, more generally adjusting the plating height through the different sized openings discussed above can compensate for any known unit and/or die level gross failing area (GFA) to improve plating uniformity (e.g., increase coplanarity across the bumps). Further, the process can be used to generate intended non-uniformities in the coplanarity of the bumps that compensate for other known GFA. For instance, the plating of metal near the outer edges of package substrates have been known to be thinner than the plating near the center of the package, thereby resulting in undesirable solder resist via depth variation and in a reduction in the margin for laser drilling. Bumps near the outer edges of the package substrates can be designed with smaller diameters or width to produce taller bumps that compensate for the thinner plating in those regions.

Notably, the height of the bumps shown in FIG. 26 does not correspond to the final height of each bump after reflow because, as described above, the reflow process results in the tin 2506 reshaping into a round or bulbous shape due to surface tension of the tin in a melted state. Thus, the particular diameter of each opening 2408 should be designed in view of the reshaping of the tin during the reflow process. Furthermore, the height of the tin after reflow may differ based on the shape of the underlying copper/nickel base (e.g., circular as in typical bumps or non-circular as described in connection with FIGS. 14-23). As such, the shape of the bumps is another design consideration that can be adjusted to alter the height of different bumps relative to other bumps.

The particular differences in diameter or width and corresponding differences in bump height shown in FIGS. 24-26 are provided by way of illustration and not necessarily representative of actual bumps. For reference, in a typical bump, the thickness for the copper 2502 above the passivation layer 2402 is approximately 7 μm, the thickness of the nickel barrier layer 2504 is approximately 3 μm, and the thickness of the tin (before reflow) is anywhere from approximately 15 μm to 20 μm. Further, in many situations, unlike what is shown in FIGS. 24-26, the difference in height from one bump to a next adjacent bump may be relatively small because warpage in a package substrate and/or die is typically gradual across the surface of the substrate and/or die rather than abrupt. However, the variability in bump heights can be relatively significant when compared across the full surface of a substrate and/or die. For instance, in some experimental work, a total difference in bump diameter or width, from the smallest diameter to the largest diameter on a package was approximately 13 μm (e.g., bump diameters varied in size from approximately 57 μm to 70 μm), resulted in a total difference in bump height from the tallest bump to the lowest bump on the package of approximately 8 μm. Thus, in this example, the variation in diameters or widths of the bumps is over 20% of the smallest diameter. In other examples, even larger variations are possible (e.g., the height of different bumps vary over 25%, 30%, 35%, etc., of the smallest diameter bump). In other examples, smaller variations may also be implemented (e.g., the height of different bumps vary over 5%, 10%, 15%, etc. of the smallest diameter bump).

As discussed above, FIG. 5 represents a common way in which each of a die 502 and an associated package substrate 504 may warp. Specifically, both the die 502 and the substrate 504 bend or curve away from each other such that the closest point between them is near a center of the die 502 with the distance between the die 502 and the substrate 504 increasing as you move outward toward the edges of the die 502 and out further to the corners of the die 502. Based on this observation, it is possible to compensate for such warping by modifying the height of the bumps across the surfaces of the die 502 and/or the substrate 504 as disclosed herein.

Figure 27:
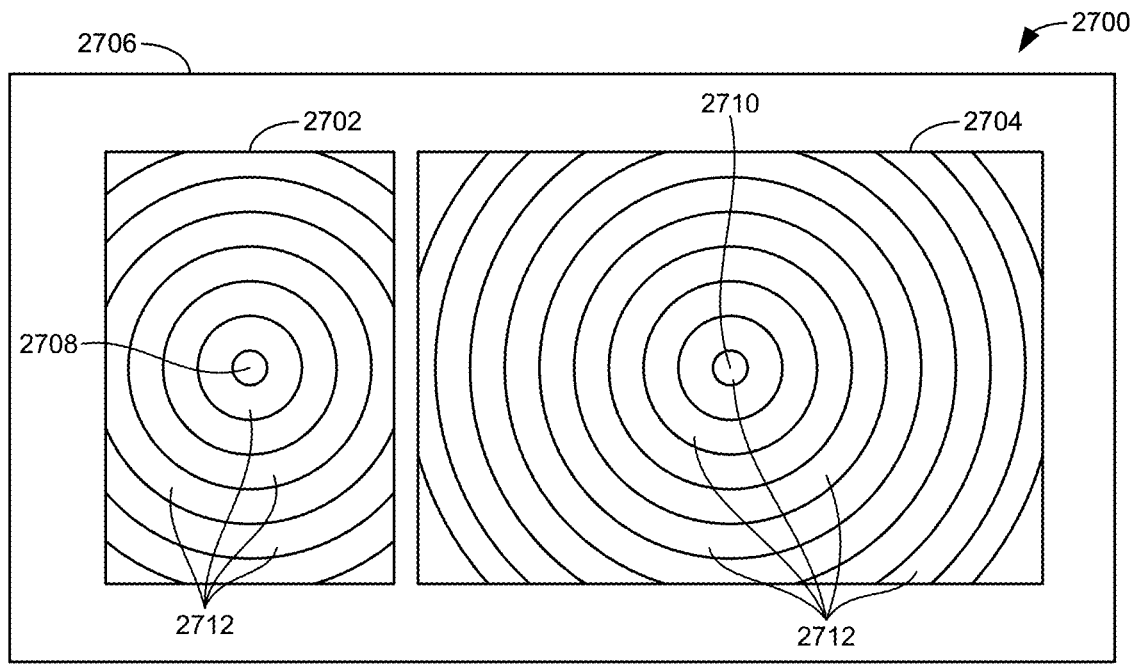
FIG. 27 illustrates an example package with separate bump height distributions defined across two separate example dies in the package.

More particularly, the footprint of an example package 2700 with two separate dies 2702, 2704 on a package substrate 2706 is illustrated in FIG. 27. Within each of the dies 2702, 2704 (or the corresponding area or shadow of the dies) is an array of concentric circles or rings centered about a center point 2708, 2710 of each respective die 2702, 2704 that define a distribution of widths (and/or corresponding heights) for the bumps that interconnect the dies 2702, 2704 and the package substrate 2706. More particularly, in this example, the area within the innermost circle and the ring shaped areas defined between adjacent ones of the circles define different regions 2712 corresponding to bumps with different heights. That is, in some examples, every bump within each annular region 2712 is designed and fabricated to have the same diameter or width and, therefore, the same height. However, the width (and corresponding height) of the bumps in each annular region 2712 differs from the width (and corresponding height) in the other regions 2712. More particularly, to compensate for the warpage represented in FIG. 5, the innermost region 2712 (corresponding to the area within the center circle) has the largest diameter bumps, with each successive region 2712 moving in a direction radially outward having bumps with smaller diameters than in the immediately preceding region 2712. Thus, the region associated with the corners of the dies 2702, 2704 have the smallest diameter bumps. The differing diameters of bumps across the areas of the dies 2702, 2704 result in the shortest bumps being near the center points 2708, 2710 with the bumps getting progressively taller as the distance from the center points 2708, 2710 increases. In other words, in such examples, the widths of the bases progressively decrease for each successive bump arranged along a line extending radially outward from the center point 2708, 2710. By contrast, the widths of the bases defined by the discrete distribution also progressively decrease for each successive bump arranged along the line, except that two or more immediately adjacent bumps along the line may have the same width.

The illustrated example of FIG. 27 represents discrete distributions with discrete regions in which bumps are disposed with the same diameter and, thus, the same height. In other examples, the diameter (and corresponding height) of each bump can be defined individually. For instance, in some examples, rather than defining annular regions 2712 in a discrete distribution, a substantially continuous gradient or continuous distribution of bump sizes (e.g., diameter and/or the corresponding height) is defined spatially across the area associated with each die 2702, 2704. In such example, each bump has a slightly different dimension relative to the immediately adjacent bumps around it that depends on the particular location of each bump relative to the gradient or distribution defined for the area of each die 2702, 2704.

Figure 28:
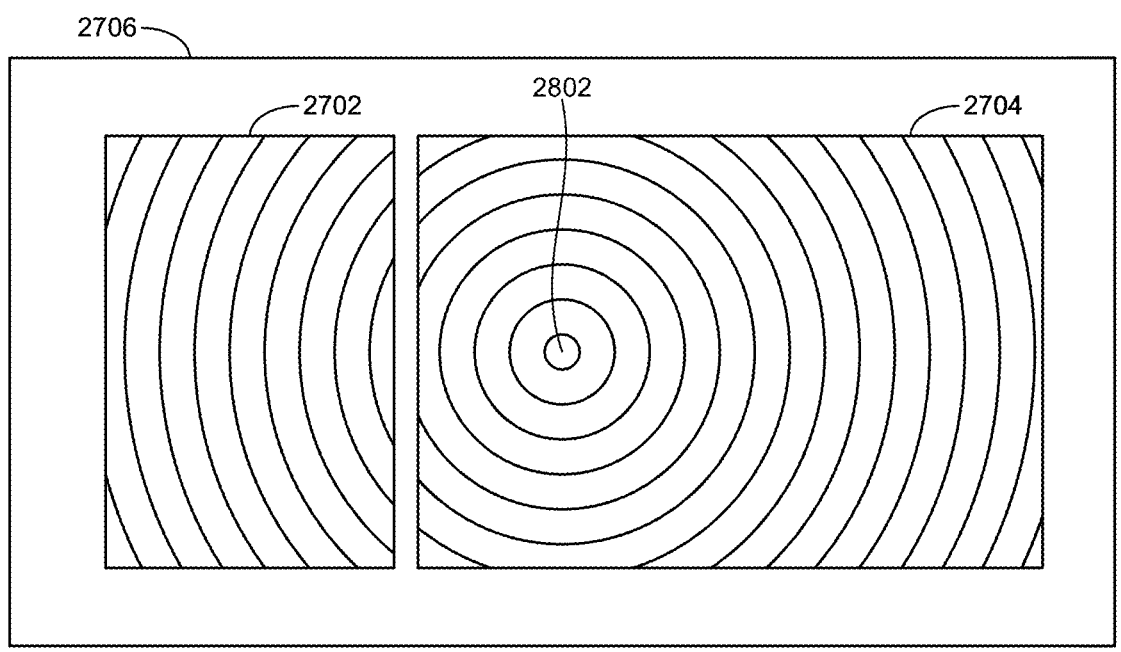
FIG. 28 illustrates an example package with a single bump height distribution defined across two separate example dies in the package.

The discrete regions and/or continuous distributions used to define the dimensions of a bump need not be circular but can be any suitable shape and may differ across the area of the dies 2702, 2704 and/or differ from one die to the other based on the particular nature of warpage to be compensated for by the resulting different heights of bumps. The distribution that defines the modulation or adjustment of bump heights spatially across the dies 2702, 2704 in FIG. 27 extends across the full area of the dies 2702, 2704. In other examples, different distributions defining different sizes and corresponding heights of bumps can be defined for particular areas of the dies 2702, 2704 such as a particular bump field (e.g., one distribution for a core bump field and a separate distribution for a bridge bump field) and/or any other suitable portion of the dies. Further, in some examples, the distribution that defines the sizes of the bumps can be defined with respect to an area that is larger than the dies 2702, 2704 (e.g., the area of the underlying package substrate 2706). That is, in some examples, rather than each die 2702, 2704 having bumps defined by a distribution for the footprint of the die, a distribution that is larger than either of the dies 2702, 2704 is defined across the surface of the package substrate 2706. An example of such a distribution is illustrated in FIG. 28. As shown in the illustrated example of FIG. 28, the distribution revolves around a single center point 2802 corresponding to the center of the package substrate 2706 and extends radially outward across the areas of both dies 2702, 2704. Notably, although the distribution shown in FIG. 28 is defined with respect to the area of the substrate 2706, the distribution is only represented within the area of the dies 2702, 2704 because that is the only areas where bumps would be located.

Figure 29:
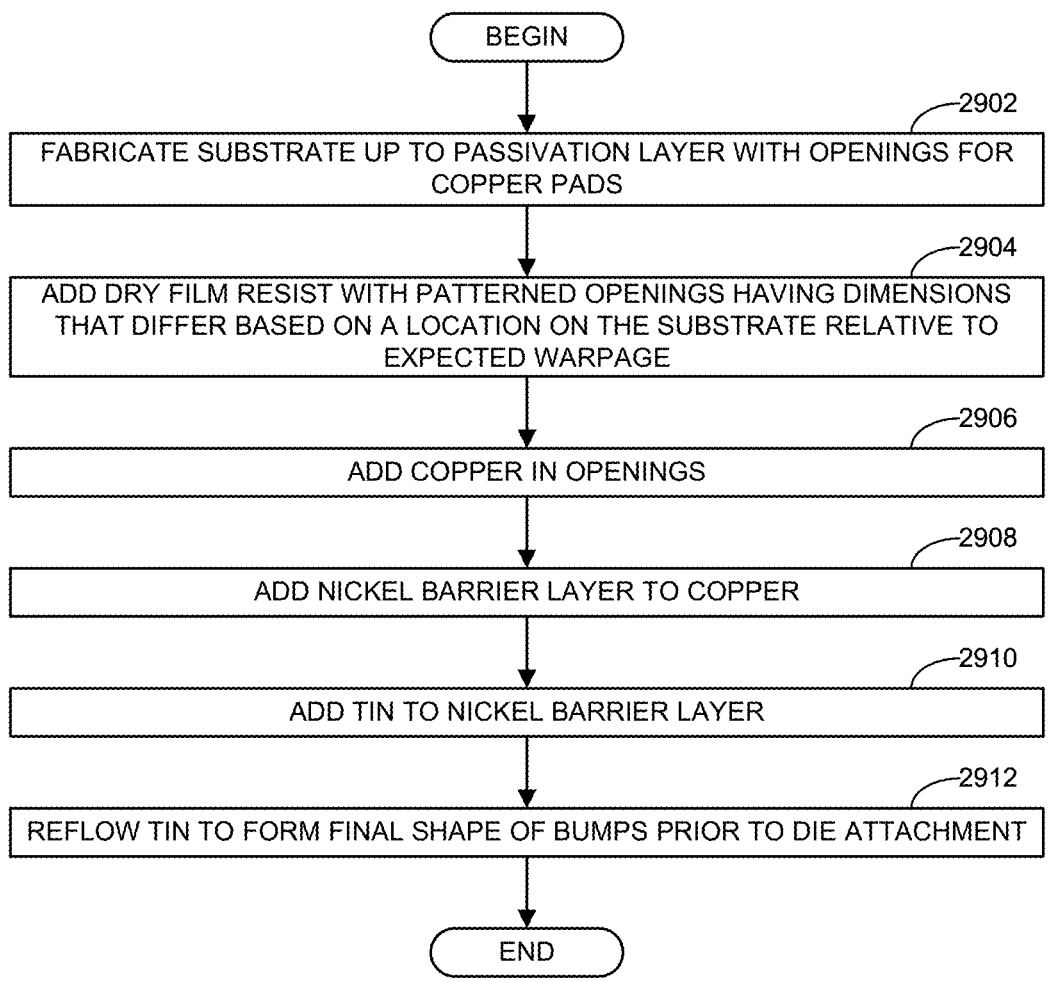
FIG. 29 is a flowchart illustrating an example method of manufacturing a substrate with bumps having different heights in accordance with teachings disclosed herein.

FIG. 29 is a flowchart illustrating an example method of manufacturing a package substrate (e.g., the package substrate 110 of FIG. 1) with bumps having different heights to compensate for expected warpage in the package substrate 110 and/or a corresponding die. Although the example method of manufacture is described with reference to the flowchart illustrated in FIG. 29, many other methods may alternatively be used. For example, the order of execution of the blocks may be changed, and/or some of the blocks described may be combined, divided, re-arranged, omitted, eliminated, and/or implemented in any other way.

The example process begins at block 2902 by fabricating the substrate 110 up to a passivation layer (e.g., the passivation layer 2402 of FIG. 24) with openings for copper pads (e.g., the openings 2404 of FIG. 24). At block 2904, the method includes adding a dry film resist (e.g., the dry film resist 2406 of FIG. 24) with patterned openings (e.g., the openings 2408 of FIG. 24) having dimensions that differ based on a location on the substrate 110 relative to the expected warpage. In some examples, the particular dimensions of the openings for a given location is defined by a distribution that extends across some or all of the package substrate 110. More particularly, in some examples, the distribution is a discrete distribution defined by discrete regions corresponding to particular dimensions such as the annular regions 2712 of FIG. 27. In other examples, the distribution is defined as a continuous distribution across the relevant area of the package substrate 110. At block 2906, the example method includes adding (e.g., via plating or other suitable deposition process) copper in the openings 2404, 2408. At block 2908, the example method includes adding (e.g., via plating or other suitable deposition process) a nickel barrier layer to the copper. At block 2910, the example method includes adding (e.g., via plating or other suitable deposition process) tin to the nickel barrier layer. Inasmuch as the dimensions of the openings differ across the substrate 110 and a substantially consistent volume of material is added to each opening, the resulting height of the tin relative to the upper surface of the passivation layer 2402 will also differ across the substrate 110. At block 2912, the method includes reflowing the tin to form a final shape of the bumps prior to die attachment. While the height of the tin before and after reflow may differ for any given bump, the final height of each bump will also differ relative to other bumps based on the different heights of the plated tin prior to reflow. Thereafter, the example method of FIG. 29 ends and the end product can be used for further processing (e.g., by attaching an associated die).

Although the method of FIG. 29 is described with respect to the fabrication of bumps on a package substrate, the method can similarly be applied to the fabrication of bumps on a die. Furthermore, the discussion of FIGS. 24-29 regarding the fabrication of bumps of differing heights to compensate for warpage applies to any types of bumps. Thus, both core bumps and bridge bumps can be fabricated with non-circular shapes. Further, the discussion of FIGS. 24-29 have been described in connection with the implementation of an array of bumps with spatially varied diameters on the package substrate 110. However, in other examples, rather than forming an array of bumps with spatially varied diameters on the substrate of a package, spatially varied bump diameters can be implemented on an underlying die onto which a separate die is attached. Further, in some examples, rather than fabricating spatially varied bump diameters on the underlying substrate (whether a package substrate or an underlying die), such bumps may alternatively be formed on the separate die (e.g., the dies 106, 108 of FIG. 1) that attach to the underlying substrate. Further, in some examples, both the underlying substrate and the attached die include bumps that vary across the area of the associated substrate and/or die. Further, in some examples, teachings disclosed in connection with FIGS. 24-29 may be combined with teachings disclosed in connection with FIGS. 6-23. Thus, in some examples, the diameter of dummy bumps (as discussed in connection with FIGS. 6-13) can vary across the substrate on which the dummy bumps are formed. Further, in some examples, bumps that differ in diameter can be circular in shape (as is typical in existing techniques) or non-circular in shape (as described in connection with FIGS. 14-23).

"Including" and "comprising" (and all forms and tenses thereof) are used herein to be open ended terms. Thus, whenever a claim employs any form of "include" or "comprise" (e.g., comprises, includes, comprising, including, having, etc.) as a preamble or within a claim recitation of any kind, it is to be understood that additional elements, terms, etc., may be present without falling outside the scope of the corresponding claim or recitation. As used herein, when the phrase "at least" is used as the transition term in, for example, a preamble of a claim, it is open-ended in the same manner as the term "comprising" and "including" are open ended. The term "and/or" when used, for example, in a form such as A, B, and/or C refers to any combination or subset of A, B, C such as (1) A alone, (2) B alone, (3) C alone, (4) A with B, (5) A with C, (6) B with C, or (7) A with B and with C. As used herein in the context of describing structures, components, items, objects and/or things, the phrase "at least one of A and B" is intended to refer to implementations including any of (1) at least one A, (2) at least one B, or (3) at least one A and at least one B. Similarly, as used herein in the context of describing structures, components, items, objects and/or things, the phrase "at least one of A or B" is intended to refer to implementations including any of (1) at least one A, (2) at least one B, or (3) at least one A and at least one B. As used herein in the context of describing the performance or execution of processes, instructions, actions, activities and/or steps, the phrase "at least one of A and B" is intended to refer to implementations including any of (1) at least one A, (2) at least one B, or (3) at least one A and at least one B. Similarly, as used herein in the context of describing the performance or execution of processes, instructions, actions, activities and/or steps, the phrase "at least one of A or B" is intended to refer to implementations including any of (1) at least one A, (2) at least one B, or (3) at least one A and at least one B.

As used herein, singular references (e.g., "a", "an", "first", "second", etc.) do not exclude a plurality. The term "a" or "an" object, as used herein, refers to one or more of that object. The terms "a" (or "an"), "one or more", and "at least one" are used interchangeably herein. Furthermore, although individually listed, a plurality of means, elements or method actions may be implemented by, e.g., the same entity or object. Additionally, although individual features may be included in different examples or claims, these may possibly be combined, and the inclusion in different examples or claims does not imply that a combination of features is not feasible and/or advantageous.

From the foregoing, it will be appreciated that example systems, methods, apparatus, and articles of manufacture have been disclosed that reduce the likelihood of defects forming in the bumps associated with first level interconnects associated with shifting in plated tin, the wicking of tin, and a lack of co-planarity across different bumps due to warpage and/or other factors. Such potential defects are reduced in a manner that enables the bumps to be fabricated with a smaller size and/or smaller spacing to meet the ongoing needs of scaling down the overall size of electronic components. The likelihood of the above-noted defects are reduced and the corresponding advantages realized by fabricating dummy bumps adjacent operational bridge bumps, fabricating bumps with non-circular shapes, and/or fabricating bumps with diameters that differ spatially across the area over which the bumps are distributed.

Example 1 includes an apparatus comprising a substrate, a semiconductor die mounted to the substrate, operational bridge bumps to electrically connect the die to a bridge within the substrate, and dummy bumps adjacent the operational bridge bumps.

Example 2 includes the apparatus of example 1, wherein the operational bridge bumps are distributed within a bridge bump field, the dummy bumps are positioned between the bridge bump field and an open space in which no bumps are located.

Example 3 includes the apparatus of any one of examples 1 or 2, wherein the dummy bumps are arranged in an array that surrounds the operational bridge bumps.

Example 4 includes the apparatus of any one of examples 1-3, wherein a diameter of the dummy bumps is a same size as a diameter of the operational bridge bumps.

Example 5 includes the apparatus of any one of examples 1-4, wherein the dummy bumps do not form a connection that extends a full distance between the die and the substrate.

Example 6 includes the apparatus of any one of examples 1-5, wherein the dummy bumps are anchored in place with corresponding metal vias, and the dummy bumps are not electrically coupled to other interconnects through the corresponding metal vias.

Example 7 includes the apparatus of any one of examples 1-6, wherein the dummy bumps are positioned in alignment with and as a continuation of a packing geometry of the operational bridge bumps.

Example 8 includes the apparatus of any one of examples 1-7, wherein the dummy bumps include at least two dummy bumps arranged in a line extending away from the operational bridge bumps.

Example 9 includes the apparatus of example 8, wherein the at least two dummy bumps is a first number of dummy bumps, the line is a first line extending away from the operational bridge bumps at a first location, the dummy bumps include a second number of dummy bumps arranged in a second line extending away from the operational bridge bumps at a second location different than the first location, the second number different than the first number.

Example 10 includes the apparatus of any one of examples 1-9, wherein the dummy bumps are positioned on the die.

Example 11 includes the apparatus of any one of examples 1-9, wherein the dummy bumps are positioned on the substrate.

Example 12 includes the apparatus of any one of examples 1-9, wherein the dummy bumps are first dummy bumps on the substrate, the apparatus further including second dummy bumps on the die.

Example 13 includes the apparatus of any one of examples 1-12, wherein the substrate corresponds to a package substrate of an integrated circuit package.

Example 14 includes the apparatus of any one of examples 1-12, wherein the die is a first die, and the substrate corresponds to a second die distinct from the first die.

Example 15 includes an integrated circuit (IC) package comprising a semiconductor die, a package substrate, first bumps to electrically couple the die to a bridge within the package substrate, and second bumps positioned between the first bumps and an open space between the package substrate and the die in which there are no bumps, the second bumps do not form a connection that extends a full distance between the die and the package substrate.

Example 16 includes the IC package of example 15, wherein the first bumps are distributed within a bridge bump field, and the second bumps are adjacent a perimeter of the bridge bump field.

Example 17 includes the IC package of example 16, wherein a first set of the second bumps are arranged in a first number of rows extending along a first edge of the bridge bump field and a second set of the second bumps are arranged in a second number of rows along a second edge of the bridge bump field, the first number of rows different than the second number of rows.

Example 18 includes the IC package of any one of examples 15-17, wherein the second bumps are dimensioned the same as the first bumps.

Example 19 includes the IC package of any one of examples 15-17, wherein the second bumps are not electrically coupled to internal interconnects within the package substrate.

Example 20 includes the IC package of any one of examples 15-17, wherein the second bumps are arranged in a same packing geometry as the first bumps.

Example 21 includes a method of manufacturing an integrated circuit (IC) package, the method comprising fabricating operational bridge bumps on at least one of a semiconductor die or a substrate to support the die, fabricating dummy bridge bumps on the at least one of the die or the substrate, the dummy bridge bumps to line an edge of an area corresponding to locations of the operational bridge bumps, and attaching the die to the substrate via the operational bridge bumps.

Example 22 includes the method of example 21, wherein, after the attaching of the die to the substrate, the dummy bridge bumps are to be spaced apart from an opposite one of the die or the substrate on which the dummy bridge bumps are disposed.

Example 23 includes the method of any one of examples 21 or 22, wherein the fabricating of the operational bridge bumps and the fabricating of the dummy bridge bumps include a common metal plating process.

Example 24 includes the method of example 23, wherein the common plating process is a first plating process, the method further including a second plating process, the second plating process to add additional height to the operational bridge bumps relative to the dummy bridge bumps.

Example 25 includes the method of any one of examples 21-24, further including forming metal vias within a passivation layer of the at least one of the die or the substrate, the metal vias not electrically coupled to other interconnects within the at least one of the die or the substrate, the dummy bridge bumps fabricated on the metal vias.

Example 26 includes the method of any one of examples 21-25, further including patterning openings in a dry film resist for both the operational bridge bumps and the dummy bridge bumps.

Example 27 includes the method of example 26, wherein openings in a dry film resist for both the operational bridge bumps and the dummy bridge bumps follow a common packing geometry.

Example 28 includes the method of any one of examples 21-27, wherein the substrate corresponds to a package substrate of an integrated circuit package.

Example 29 includes the method of any one of examples 21-27, wherein the die is a first die, and the substrate corresponds to a second die distinct from the first die.

Example 30 includes an apparatus comprising a substrate, a semiconductor die mounted to the substrate, and bumps to electrically couple the die to the substrate, ones of the bumps having corresponding bases, the bases having a shape that is non-circular.

Example 31 includes the apparatus of example 30, wherein the shape corresponds to a polygon.

Example 32 includes the apparatus of any one of examples 30 or 31, wherein the shape corresponds to a packing geometry of the bumps.

Example 33 includes the apparatus of any one of examples 30-32, wherein the shape is an octagon.

Example 34 includes the apparatus of any one of examples 30-32, wherein the shape is a hexagon.

Example 35 includes the apparatus of example 34, wherein a packing geometry of the bumps is a hexagonal packing geometry.

Example 36 includes the apparatus of example 35, wherein corners of the hexagon shape of a first one of the bumps point to corners of other ones of the bumps that are closest to the first one of the bumps.

Example 37 includes the apparatus of example 35, wherein corners of the hexagon shape of a first one of the bumps point between other ones of the bumps that are closest to the first one of the bumps.

Example 38 includes the apparatus of any one of examples 30-37, wherein the bumps are core bumps.

Example 39 includes the apparatus of any one of examples 30-37, wherein the bumps are bridge bumps.

Example 40 includes the apparatus of any one of examples 30-39, wherein the bases of the ones of the bumps are positioned on the die.

Example 41 includes the apparatus of any one of examples 30-39, wherein the bases of the ones of the bumps are positioned on the substrate.

Example 42 includes the apparatus of any one of examples 30-39, wherein at least some of the bases of the ones of the bumps are positioned on the substrate and some of the bases of the ones of the bumps are positioned on the die.

Example 43 includes the apparatus of any one of examples 30-42, wherein the substrate corresponds to a package substrate of an integrated circuit package.

Example 44 includes the apparatus of any one of examples 30-42, wherein the die is a first die, and the substrate corresponds to a second die distinct from the first die.

Example 45 includes an integrated circuit (IC) package comprising a semiconductor die, a package substrate, and an array of bumps arranged on a surface of at least one of the die or the package substrate, the bumps to electrically couple the die to the package substrate, a first bump of the array of bumps having a base with a first dimension measured in a first direction parallel to the surface, the base having a second dimension measured in a second direction parallel the surface, the first direction different than the second direction, the first dimension smaller than the second dimension.

Example 46 includes the IC package of example 45, wherein the base has a shape that includes at least one straight side.

Example 47 includes the IC package of example 46, wherein shape corresponds to a polygon, the first dimension corresponds to an inner diameter of the polygon, and the second dimension corresponds to an outer diameter of the polygon.

Example 48 includes the IC package of any one of examples 45-47, wherein the first dimension is at least 5% smaller than the second dimension.

Example 49 includes the IC package of any one of examples 45-48, wherein the base has a hexagon shape.

Example 50 includes the IC package of example 49, wherein the base is a first base, and a second bump of the array of bumps has a second base, the second base having a hexagonal shape, a shortest distance between the first base and the second base corresponding to a spacing between facing sides of the hexagonal shapes of the first and second bases in a direction normal to the sides.

Example 51 includes the IC package of example 49, wherein the base is a first base, and a second bump of the array of bumps has a second base, the second base having a hexagonal shape, a first distance extending between proximate corners of the hexagonal shapes of the first and second bases being less than a second distance extending between midpoints of proximate sides of the hexagonal shapes of the first and the second bases.

Example 52 includes a method of manufacturing an integrated circuit (IC) package, the method comprising fabricating bases for bumps to electrically couple a die to a substrate, the bases having a shape that is non-circular, adding tin onto the bases, and attaching the die to the substrate using the tin.

Example 53 includes the method of example 52, wherein the fabricating of the bases for the bumps includes patterning a dry film resist with openings having the shape that is non-circular, and adding, via plating, metal in the openings.

Example 54 includes the method of example 53, wherein the patterning of the dry film resist includes distributing the openings based on a packing geometry corresponding to the shape that is non-circular.

Example 55 includes the method of any one of examples 53 or 54, wherein the tin is added into the openings.

Example 56 includes the method of any one of examples 52-55, wherein the bases are positioned on the die.

Example 57 includes the method of any one of examples 52-55, wherein the bases are positioned on the substrate.

Example 58 includes the method of any one of examples 52-57, wherein the substrate corresponds to a package substrate of an integrated circuit package.

Example 59 includes the method of any one of examples 52-57, wherein the die is a first die, and the substrate corresponds to a second die distinct from the first die.

Example 60 includes an apparatus comprising a substrate, a semiconductor die mounted to the substrate, and an array of bumps to electrically couple the die to the substrate, each of the bumps having a corresponding base, different ones of the bases having different widths that vary spatially across the array of bumps.

Example 61 includes the apparatus of example 60, wherein the bumps include tin on the bases, the tin and different ones of the bases defining corresponding interfaces therebetween, different ones of the interfaces being different distances from a surface on which the bases are formed.

Example 62 includes the apparatus of example 61, wherein the distances of the different ones of the interfaces from the surface of the substrate increase as the widths of the corresponding bases decrease.

Example 63 includes the apparatus of any one of examples 60-62, wherein the different widths vary spatially across the array of bumps according to a distribution.

Example 64 includes the apparatus of example 63, wherein the distribution is a substantially continuous distribution.

Example 65 includes the apparatus of example 63, wherein the distribution is a discrete distribution defined by incremental changes to a plurality of different regions associated with the distribution.

Example 66 includes the apparatus of any one of examples 63-65, wherein the distribution corresponds to an area larger than a footprint of the die.

Example 67 includes the apparatus of any one of examples 63-65, wherein the distribution corresponds to an area smaller than a footprint of the die.

Example 68 includes the apparatus of any one of examples 63-65, wherein the distribution corresponds to an area corresponding to a footprint of the die.

Example 69 includes the apparatus of any one of examples 60-68, wherein ones of the bumps with the different widths have a constant pitch.

Example 70 includes the apparatus of any one of examples 60-69, wherein the bumps are core bumps.

Example 71 includes the apparatus of any one of examples 60-69, wherein the bumps are bridge bumps.

Example 72 includes the apparatus of any one of examples 60-71, wherein the bases of the ones of the bumps are positioned on the die.

Example 73 includes the apparatus of any one of examples 60-71, wherein the bases of the ones of the bumps are positioned on the substrate.

Example 74 includes the apparatus of any one of examples 60-71, wherein at least some of the bases of the ones of the bumps are positioned on the substrate and some of the bases of the ones of the bumps are positioned on the die.

Example 75 includes the apparatus of any one of examples 60-74, wherein the substrate corresponds to a package substrate of an integrated circuit package.

Example 76 includes the apparatus of any one of examples 60-74, wherein the die is a first die, and the substrate corresponds to a second die distinct from the first die.

Example 77 includes an integrated circuit (IC) package comprising a semiconductor die, a package substrate, and an array of bumps distributed across an area of a surface of at least one of the die or the package substrate, the bumps to electrically couple the die to the package substrate, each of the bumps having a corresponding base with an associated width, the widths of different ones of the bases corresponding to different ones of a plurality of different widths ranging from a smallest width to a largest width.

Example 78 includes the IC package of example 77, wherein the bumps include tin on the bases, the tin and different ones of the bases defining corresponding interfaces therebetween, different ones of the interfaces being different distances from the surface.

Example 79 includes the IC package of any one of examples 77 or 78, wherein the widths of the bases progressively decrease for different ones of the bumps arranged along a line.

Example 80 includes the IC package of any one of examples 77-70, wherein a first set of the bumps are in a first region of the array of bumps and a second set of bumps are in a second region of the array of bumps, the widths of the bases of the first set of the bumps being a first width, the widths of the bases of the second set of bumps being a second width greater than the first width.

Example 81 includes the IC package of example 80, wherein the first and second regions correspond to concentric annular rings.

Example 82 includes the IC package of any one of examples 80 or 81, wherein the first region surrounds the second region.

Example 83 includes the IC package of any one of examples 77-82, wherein the plurality of different widths are defined by a distribution of bump widths that spatially vary across the area of the surface.

Example 84 includes a method of manufacturing an integrated circuit (IC) package, the method comprising fabricating an array of bumps on a surface, the bumps to electrically couple a die to a substrate, each of the bumps having a corresponding base, different ones of the bases having different widths that vary spatially across the array of bumps, and attaching the die to the substrate via the bumps.

Example 85 includes the method of example 84, wherein the fabricating of the array of bumps includes adding dry film resist to the surface, patterning openings in the dry film resist, different ones of the openings having different dimensions corresponding to the different widths of the different ones of the bases, and adding metal into the openings.

Example 86 includes the method of example 85, wherein the adding of the metal into the openings includes a plating process in which a substantially constant amount of volume is added in different ones of the openings.

Example 87 includes the method of any one of examples 85 or 86, wherein the different dimensions of the different ones of the openings are defined by a discrete distribution, the discrete distribution defining different regions associated with incremental differences in the different dimensions of the different ones of the openings.

Example 88 includes the method of any one of examples 85 or 86, wherein the different dimensions of the different ones of the openings are defined by a substantially continuous distribution in which a particular dimension of a particular opening depends on a location of the opening relative to the distribution.

Although certain example systems, methods, apparatus, and articles of manufacture have been disclosed herein, the scope of coverage of this patent is not limited thereto. On the contrary, this patent covers all systems, methods, apparatus, and articles of manufacture fairly falling within the scope of the claims of this patent.

The following claims are hereby incorporated into this Detailed Description by this reference, with each claim standing on its own as a separate embodiment of the present disclosure.

What is claimed is:

1. An apparatus comprising:
a substrate;
a semiconductor die mounted to the substrate; and
bumps to electrically couple the die to the substrate, first and second ones of the bumps adjacent one another and having corresponding first and second bases, the first base having a first hexagonal shape with a first corner opposite a second corner, the second base having a second hexagonal shape with a third corner opposite a fourth corner, the first, second, third, and fourth corners aligned along a straight line.

2. The apparatus of claim 1, wherein a packing geometry of the bumps is a hexagonal packing geometry.

3. The apparatus of claim 2, wherein other corners of the first hexagonal shape of the first base point to corners of other ones of the bumps that are adjacent to the first and second ones of the bumps.

4. The apparatus of claim 1, wherein the bumps are core bumps.

5. The apparatus of claim 1, wherein the bumps are bridge bumps.

6. The apparatus of claim 1, wherein the first and second bases of the respective first and second ones of the bumps are on the die.

7. The apparatus of claim 1, wherein the first and second bases of the respective first and second ones of the bumps are on the substrate.

8. The apparatus of claim 1, wherein the first base of the first one of the bumps is on the substrate and a third base of a third one of the bumps is on the die.

9. The apparatus of claim 1, wherein the substrate corresponds to a package substrate of an integrated circuit package.

10. The apparatus of claim 1, wherein the die is a first die, and the substrate corresponds to a second die distinct from the first die.

11. The apparatus of claim 1, wherein the first one of the bumps includes tin on the first base, the tin to overhang a midpoint of a sidewall of the hexagonal shape of the first base by a first extent, the tin to overhang a corner of the hexagonal shape of the first base by a second extent, the first extent greater than the second extent.

12. The apparatus of claim 1, wherein the first one of the bumps includes tin on the first base, and the first base includes a copper layer and a nickel layer, the nickel layer between the copper layer and the tin.

13. An integrated circuit (IC) package comprising:
a semiconductor die;
a package substrate; and
an array of bumps arranged on a surface of at least one of the die or the package substrate, the bumps to electrically couple the die to the package substrate, a first bump of the array of bumps having a first base, the first base having a first hexagonal shape, a second bump of the array of bumps having a second base, the second base having a second hexagonal shape, a first distance extending between closest corners of the first and second hexagonal shapes being less than a second distance extending between midpoints of closest sides of the first and second hexagonal shapes.

14. The IC package of claim 13, wherein the base has a shape that includes at least one straight side.

15. A method of manufacturing the integrated circuit (IC) package of claim 13, the method comprising:
fabricating the first and second bases for the first and second bumps to electrical couple the die to the substrate,
adding tin onto the bases; and
attaching the die to the substrate using the tin.

16. The method of claim 15, wherein the fabricating of the first and second bases for the first and second bumps includes:
patterning a dry film resist with first and second openings having the first and second hexagonal shape; and
adding metal in the openings via plating.

17. The method of claim 16, wherein the patterning of the dry film resist includes distributing the openings based on a hexagonal packing geometry.

18. The method of claim 16, wherein the tin is added into the first and second openings.

19. The method of claim 16, wherein the metal includes a layer of copper and a layer of nickel.

20. The method of claim 15, wherein the bases are on the die.

21. The method of claim 15, wherein the bases are on the substrate.

22. The method of claim 15, wherein the substrate corresponds to a package substrate of an integrated circuit package.

23. The method of claim 15, wherein the die is a first die, and the substrate corresponds to a second die distinct from the first die.

24. The method of claim 15, including a reflow process that causes the tin on the first base to take on a bulbous shape, the bulbous shape of the tin defining a first angle relative to a sidewall of the first base in a first cross-section, the bulbous shape of the tin defining a second angle relative to a sidewall of the base in a second cross-section, the second cross-section angled relative to the first cross-section, the first angle different from the second angle.

25. The method of claim 24, wherein the first cross-section extends through midpoints of opposing sides of the first hexagonal shape of the first base, and the second cross-section extends through opposing corners of the first hexagonal shape of the first base, the second angle greater than the first angle.

\* \* \* \* \*